(12) United States Patent
Delva

(10) Patent No.: US 7,535,387 B1
(45) Date of Patent: May 19, 2009

(54) METHODS AND SYSTEMS FOR IMPLEMENTING CONTEXT ADAPTIVE BINARY ARITHMETIC CODING

(75) Inventor: Justin G. Delva, Austin, TX (US)

(73) Assignee: XILINX, Inc., San Jose, CA (US)

( * ) Notice: Subject to any disclaimer, the term of this patent is extended or adjusted under 35 U.S.C. 154(b) by 0 days.

(21) Appl. No.: 11/900,224

(22) Filed: Sep. 10, 2007

(51) Int. Cl.
H03M 7/00 (2006.01)
(52) U.S. Cl. ......................... 341/107; 341/50
(58) Field of Classification Search ............ 341/50, 341/67, 107, 65
See application file for complete search history.

(56) References Cited

U.S. PATENT DOCUMENTS 6,940,429 B2 * 9/2005 Sankaran ............... 341/65
7,365,659 B1 * 4/2008 Hoffmann et al. .......... 341/107
7,397,402 B1 * 7/2008 Hu ....................... 341/107

OTHER PUBLICATIONS

H.264 CABAC Encoder Core v1.0, DS603 (v1.0), May 31, 2007, Advance Product Specification, 94 pages, Xilinx, Inc. 2100 Logic Drive, San Jose, California, http://www.xilinx.com/bvdocs/ipcenter/data_sheet/h264_cabac_ds603.pdf.

* cited by examiner

Primary Examiner—Brian Young
(74) Attorney, Agent, or Firm—W. Eric Webostad; Thomas George

(57) ABSTRACT

An entropy encoder module (350) is configured to completely perform normalization of each binary input in a single clock cycle for Context Adaptive Binary Arithmetic Coding (CABAC). Outstanding bits are separated out from other bits of a portion of a frame for Context Adaptive Binary-Arithmetic Coding (CABAC). The outstanding bits are parsed responsive to location marking, counting, and bit masking to provide insert bits. The insert bits are inserted into the encoded bitstream for output. A Context Adaptive Binary Arithmetic Coding ("CABAC") system includes: digital information storage (301) having digital video information stored therein; and a CABAC encoder (200) coupled to the digital information storage (301) to receive a portion of the digital video information at a time.

39 Claims, 27 Drawing Sheets

```
static const int INIT_MB_AFF_I[1][1][4][2] = // 8
{
  //----- model 0 -----
  {
    {{ 0, 11},{ 1, 55},{ 0, 69}, CTX_UNUSED }
  }
};
static const int INIT_MB_AFF_P[3][1][4][2] = // 24
{
  //----- model 0 -----
  {
    {{ 0, 45},{ -4, 78},{ -3, 96}, CTX_UNUSED }
  },
  //----- model 1 -----
  {
    {{ 13, 15},{ 7, 51},{ 2, 80}, CTX_UNUSED }
  },
  //----- model 2 -----
  {
    {{ 7, 34},{ -9, 88},{-20, 127}, CTX_UNUSED }
  }
};
```

```
void biari_init_context (BiContextTypePtr ctx, const int* ini, int qp)
{
  int pstate; // Probability State pstate = ((ini[0]* max(0, qp)) >> 4) + ini[1];
  pstate = min (max ( 1, pstate), 126);

if ( pstate >= 64 )
  {
    ctx->state = pstate - 64;
    ctx->MPS   = 1;
  }
  else
  {
    ctx->state = 63 - pstate;
    ctx->MPS   = 0;
  } ctx->count = 0;
}
```

FIG. 17B

```
void biari_encode_symbol(EncodingEnvironmentPtr eep, signed short symbol, BiContextTypePtr bi_ct )
{
  register unsigned int range = Erange;
  register unsigned int low = Elow;
  unsigned int rLPS = rLPS_table_64x4[bi_ct->state][(range>>6) & 3];

#if (2==TRACE)
  if (cabac_encoding)
    fprintf(p_trace, "%d 0x%04x %d %d\n", binCount++, Erange , bi_ct->state, bi_ct->MPS );
endif range -= rLPS;
  bi_ct->count += cabac_encoding;

symbol = (symbol != 0);

if (symbol != bi_ct->MPS)
  {
    low += range;
    range = rLPS;
  } if (!bi_ct->state)
    bi_ct->MPS = bi_ct->MPS ^ 1;
    bi_ct->state = AC_next_state_LPS_64[bi_ct->state];
  }
  else
    bi_ct->state = AC_next_state_MPS_64[bi_ct->state];

while (range < QUARTER)
  {
    if (low >= HALF)
    {
      put_one_bit_plus_outstanding(1);
      low -= HALF;
    }
    else if (low < QUARTER)
    {
      put_one_bit_plus_outstanding(0);
    }
    else
    {
      Ebits_to_follow++;
      low -= QUARTER;
    }
    low <<= 1;
    range <<= 1;
  }
  Erange = range;
  Elow = low;
  eep->C++;
}
```

(PRIOR ART)
FIG. 19

```
#define put_byte() { \
        Ecodestrm[(*Ecodestrm_len)++] = Ebuffer; \
        Ebits_to_go = 8; \
        while (eep->C > 7) { \
          eep->C-=8; \
          eep->E++; \
        } \
      } define put_one_bit(b) { \
        Ebuffer <<= 1; Ebuffer |= (b); \
        if (--Ebits_to_go == 0) \
          put_byte(); \
      } define put_one_bit_plus_outstanding(b) { \
        put_one_bit(b); \
        while (Ebits_to_follow > 0) \
        { \
          Ebits_to_follow--; \
          put_one_bit(!(b)); \
        } \
      }
```

(PRIOR ART)
FIG. 20

METHODS AND SYSTEMS FOR IMPLEMENTING CONTEXT ADAPTIVE BINARY ARITHMETIC CODING

FIELD OF THE INVENTION

One or more aspects of the invention relate generally to encoding and, more particularly, to methods and systems for implementing context adaptive binary arithmetic coding ("CABAC").

BACKGROUND OF THE INVENTION

Programmable logic devices ("PLDs") are a well-known type of integrated circuit that can be programmed to perform specified logic functions. One type of PLD, the field programmable gate array ("FPGA"), typically includes an array of programmable tiles. These programmable tiles can include, for example, input/output blocks ("IOBs"), configurable logic blocks ("CLBs"), dedicated random access memory blocks ("BRAMs"), multipliers, digital signal processing blocks ("DSPs"), processors, clock managers, delay lock loops ("DLLs"), and so forth. As used herein, "include" and "including" mean including without limitation.

One such FPGA is the Xilinx Virtex™ FPGA available from Xilinx, Inc., 2100 Logic Drive, San Jose, Calif. 95124. Another type of PLD is the Complex Programmable Logic Device ("CPLD"). A CPLD includes two or more "function blocks" connected together and to input/output ("I/O") resources by an interconnect switch matrix. Each function block of the CPLD includes a two-level AND/OR structure similar to those used in Programmable Logic Arrays ("PLAs") and Programmable Array Logic ("PAL") devices. Other PLDs are programmed by applying a processing layer, such as a metal layer, that programmably interconnects the various elements on the device. These PLDs are known as mask programmable devices. PLDs can also be implemented in other ways, for example, using fuse or antifuse technology. The terms "PLD" and "programmable logic device" include but are not limited to these exemplary devices, as well as encompassing devices that are only partially programmable.

For purposes of clarity, FPGAs are described below though other types of PLDs may be used. FPGAs may include one or more embedded microprocessors. For example, a microprocessor may be located in an area reserved for it, generally referred to as a "processor block."

As is known, arithmetic coding ("AC") may be used for an entropy encoder. In AC, each symbol to be encoded is assigned a probability of occurrence and a sub-range. Sub-ranges for each symbol follow from the assigned probability and the sequence of symbols. An initial range is set as being between 0 and 1. As each symbol is processed, an encoder restricts the range to a smaller interval than this initial interval responsive to the corresponding sub-range for the symbol. After a sub-range of an initial symbol is used to set a new range smaller than the initial range of 0 to 1, a sub-range for a next symbol further restricts the smaller range.

As is known, lower and upper bounds of sub-ranges indicate percentages of a range for setting a new more restricted range. For entropy encoding, conventionally a sequence of encoded symbols is reduced to a final sub-range value, which may be transmitted as a number of bits. Conventionally, this number of bits is represented in a fixed point notation.

Thus, AC assigns a fixed code length to a sequence of symbols based upon their probability of occurrence ("P") as indicated above, where the fixed code length is represented by the number of bits used to express the final sub-range value for the sequence of symbols and has a bit length equivalent to $\log_2(1/P)$. It should be understood that as the number of symbols in a sequence increases, the fractional number extends further to the right of a decimal point, for example. Accordingly, as the fractional number extends further to the right of the decimal point, more bits are used to encode the sequence of symbols.

Context Adaptive Binary Arithmetic Coding ("CABAC") involves a similar encoding process as AC, but with the following differences. In CABAC, symbols to encode are single bit values, namely either a logic 1 or a logic 0. This is known as a "binary format," and may be contrasted with a fractional value between 0 and 1 in AC. Thus, if a symbol is not in a binary format, it is binarized prior to encoding. Bits obtained from such binarization are referred to as "binarized bits," "bins," or "symbols," and such symbols are sequentially encoded using CABAC.

For AC, a probability value assigned to a symbol is static; however, in CABAC dynamic probability values for symbols are used. By dynamic probabilities, it is meant that probability for a symbol is updated in each associated succeeding encoding pass. In CABAC, probability of a symbol may be estimated from its context information ("context"), and from previous probability(ies) of such symbol, if any, due to the iterative nature of dynamic probability values as previously described.

As previously indicated, in AC it is assumed that more bits may be added to represent a constricting sub-range value. However, in CABAC, the number of bits for specifying range ("RANGE") is fixed. In CABAC, RANGE is bounded by a low value ("LOW" or "L")) and a high value ("HIGH" or "H"). To adjust LOW and HIGH RANGE interval markers to meet the fixed bit restriction, normalization is used. During normalization, bits may be shifted out and be inserted into an output stream.

For a given context, a symbol is encoded as either a most probable symbol ("MPS") or a least probable symbol ("LPS"). This distinction as between symbols is generally for having long strings of either a logic 0 or a logic 1 to enhance compression efficiency. Within a sub-range, probability of an LPS is given by $P_{LPS}$. Likewise, within a sub-range, probability of an MPS is given as $P_{MPS}$. Because $P_{MPS}$ equals probability of a symbol ("$P_{symbol}$") minus $P_{LPS}$, conventionally often only $P_{LPS}$ is used. Within a sub-range, CABAC defines two subintervals, namely an LPS RANGE ("$RANGE_{LPS}$") which is equal to RANGE multiplied by $P_{LPS}$, and an MPS RANGE ("$RANGE_{MPS}$") which is equal to RANGE minus $RANGE_{LPS}$.

FIG. 19 is a code listing depicting binary arithmetic encoding code listing 1900 of the prior art. Listing 1900 is part of a Joint Model ("JM") source code reference as is known. JM reference software is a widely accepted reference point for developers of H.264 applications. The H.264 standard calls for CABAC for providing an entropy encoder. The output of CABAC is a compressed bitstream as specified by the ITU-T Video Coding Experts Group ("VCEG") together with the ISO/IEC Moving Picture Experts Group ("MPEG") as the product of a collective partnership effort known as the Joint Video Team ("JVT"). The collaborative effort is also known as H.264/AVC/MPEG4 Part 10.

Briefly, listing 1900 is for arithmetic encoding of one binary symbol by using a probability estimate of its associated context model. There are three main functions of listing 1900, namely to update the probability of a current symbol, to perform normalization of an encoding interval, and to insert "outstanding bits" into an output bitstream.

Pointer 1901 points to where the stream to be encoded is located. Only one bit is encoded at a time. Furthermore, it should be appreciated that normalization/renormalization ("normalization") loop 1922 takes up to seven iterations to encode one bit. Input parameters to the function "biari_encode_symbol" are generally indicated by pointers 1901, 1902, and 1904. An "eep" pointer 1901 references a data structure of an encoded output stream. Pointers 1904 and 1902 reference the information for encoding, namely generally the symbol to encode and the associated context information, respectively. More particularly, the parameter "symbol" associated with pointer 1904 has two valid data states, either a logic 0 or a logic 1. Pointer 1904 indicates the bit to be encoded. If the value to encode is not in a binary format, it is first binarized prior to encoding.

After binarization, each resulting symbol is serially encoded. At each iteration, the function "birai_encode_symbol" is used. The parameter "bi_ct" is a pointer 1902 to a context information data structure for the symbol to be encoded. The context information data structure contains a state field and an MPS field. The state field is an index of assigned probability of a current symbol in the data structure, such as a probability table. The MPS field has either a logic 1 or a logic 0. The value of bi_ct state represents the probability of the current symbol to encode. The determination that the current symbol is the MPS forces a long string of logic 0s or logic 1s, depending which is set in the MPS field. Longer strings increase encoding efficiency.

As is known, for CABAC encoding, intervals are divided and thus there is a new RANGE and new LOW determined for encoding of each symbol. A symbol to encode 1904 has associated context information as indicated by pointer 1902. As generally indicated by arrow 1903, encoding interval boundaries described above are represented. Similar to the L boundary, the variable Elow is the lower end of the interval for a given symbol. The H boundary, which is omitted, may be recovered by performing: H=Elow+Erange, where the variable Erange is the length of the probability interval of the symbol. The variable Erange is the same as the previously described interval metric RANGE.

LPS range variable rLPS may be updated using a two dimensional array rLPS_table_64×4[64][4], as generally indicated by pointer 1905. This array is used to perform the update operation of: $RANGE_{LPS}=RANGE \times P_{LPS}$. In lieu of a multiplication, the update uses a look-up table. Arrow 1906 generally indicates the update of the MPS sub-range through the prefix operator "–=", namely $RANGE_{MPS}$ may be determined by subtracting $RANGE_{LPS}$ from the RANGE.

Initially, Elow or L is logic zeros prior to encoding, and thus the initial value of Erange is also zero. As generally indicated at 1907, if the current symbol is not an MPS, the L and Range values are updated. If a symbol to be encoded is an LPS, a LOW is adjusted as well as the RANGE is adjusted as indicated at 1907. Additionally, if a symbol to be encoded is an LPS, MPS is updated for a zero probability and a probability estimate is adjusted as being an LPS as indicated at 1918. If, however, a symbol to be encoded is not an LPS, a probability is adjusted as an MPS as indicated at 1919.

As generally indicated at 1918 and 1919, probability update is performed on bi_ct state. Note that the field "state" of the bi_ct data structure is the index into a probability table. If the symbol is not an MPS, the index points to a location of an LPS probability table as generally indicated at 1918. If the symbol is an MPS, the index points to a location in the MPS probability table, as generally indicated at 1919.

For each symbol that the function "biari_encode_symbol" processes, normalization loop 1922 may take up to seven iterations. Even though a listing 1900 is illustratively shown, it should be appreciated that listing 1900 may be instantiated in hardware to provide part of a CABAC encoder. Accordingly, it should be appreciated that as values such as LOW and RANGE are updated, such values may fall out of a bit range usable by such an encoder. Normalization loop 1922 is used to bring such values back within a bit range. Again, it should be appreciated that such normalization loop 1922 may take up to seven iterations, which when implemented in hardware may take multiple clock cycles per symbol. For RANGE less than QUARTER, outstanding bits are inserted for conditions, such as indicated at 1908 and 1909, within normalization loop 1922.

FIG. 20 is a program listing depicting an exemplary embodiment of a macro for writing bytes into the output stream, namely macro 2000, of the prior art. Macro 2000 is part of a JM source code reference as is known. Macro 2000, which defines insertion of outstanding bits (e.g., put_one_bit_plus_outstanding(b)) has either a logic '1' or '0' bit as its input parameter. The input parameter bit is then inserted directly into the output bit encoding stream as generally indicated at 2001. Macro 2000 then inserts sequentially a total of Ebits_to_follow 2003 number of bits into the output encoding stream. These inserted bits are all the bitwise complement of the original macro's input parameter bit. As generally indicated at 2002, Ebits_to_follow is a counter for outstanding bits. If this counter is greater than zero, and when LOW is greater than or equal to HALF and LOW is less than QUARTER, then the number of bits represented by the counter is inserted into the output encoding stream.

In addition to normalization loop 1922, the insertion of outstanding bits inside macro 2000 is an additional nested loop. This means that there may be several loops of macro 2000 per symbol. Even though there are conditions in which outstanding bits are not inserted within an iteration of normalization loop 1922, it should be appreciated that there is an accumulation and thus eventually all such outstanding bits are inserted into an output encoding stream. Thus, it should be appreciated that both macro 2000 and normalization loop 1922 may be significant impediments to real-time CABAC encoding.

As indicated above, for each binary input or bit to be encoded, there basically exist two potential bottlenecks which would limit real-time CABAC encoding for implementation in an FPGA, particularly for HD sequences. Thus, it would be desirable to have a more efficient normalization/renormalization procedure than that described above.

SUMMARY OF THE INVENTION

One or more aspects generally relate to encoding and more particularly, to context adaptive binary arithmetic coding ("CABAC").

An aspect relates generally to an apparatus including an entropy encoder module configured to completely perform normalization of each binary input in a single clock cycle for Context Adaptive Binary Arithmetic Coding (CABAC). The entropy encoder module includes calculation blocks coupled in series and coupled to receive a clock signal. An initial calculation block of the calculation blocks is coupled to receive an input; and each of the calculation blocks represents an iteration of a normalization for the CABAC.

Another aspect relates generally to a method for entropy encoding, including: obtaining a RANGE input and a LOW input associated with Context Adaptive Binary Arithmetic Coding (CABAC); selecting an iteration number responsive to the RANGE input and the QUARTER input; selecting a normalized RANGE responsive to the QUARTER input and the RANGE input; inputting the LOW input to an initial LOW calculation block of LOW calculation blocks coupled in series; normalizing the LOW input with the initial LOW calculation block; registering the normalized LOW input in a first register of the initial LOW calculation block on a clock cycle of a clock signal; propagating the normalized LOW input registered to a second register of next LOW calculation block in the series on a next clock cycle of the clock signal, where the first register and the second register are clocked by the clock signal; generating normalized LOWs respectively from the LOW calculation blocks; selecting from among the LOW input and the normalized LOWs, a LOW output responsive to the iteration number; and outputting an encoded bitstream using in part the LOW output.

Yet another aspect relates generally to a method for entropy encoding, including: obtaining a portion of a frame of image information to encode; separating out outstanding bits from most other bits of the portion for Context Adaptive Binary Arithmetic Coding (CABAC); updating probability and context information associated with the portion; normalizing using the other bits and the updated probability and context information to provide an encoded bitstream; parsing the outstanding bits responsive to location marking, counting, and bit masking to provide insert bits, the outstanding bits being parsed after the normalizing; inserting the insert bits associated with the outstanding bits into the encoded bitstream; and outputting the encoded bitstream.

Still yet another aspect relates generally to a Context Adaptive Binary Arithmetic Coding ("CABAC") system, including: digital information storage having digital video information stored therein; and a CABAC encoder coupled to the digital information storage to receive a portion of the digital video information at a time. The portion includes symbols to encode. The CABAC encoder includes an arithmetic coding encoding engine having a binarizer, a binary arithmetic encoder, and contexts memory. The binarizer is configured to binarize each symbol of the portion received to provide each associated binarized symbol. The contexts memory has probability models accessible by the binary arithmetic encoder for the encoding of the binarized symbol. The binary arithmetic encoder is configured to encode the binarized symbol using a selected probability model associated with the binarized symbol, where the probability model is obtained from the probability models in the contexts memory.

Further still yet another aspect relates generally to a binarizer for a Context Adaptive Binary Arithmetic Coding ("CABAC") engine. The binarizer includes in part: a binarization controller coupled to receive Syntax Element ("SE") data, an encode select signal, and a mode select signal; and binarization blocks coupled to the binarization controller for receiving the SE data therefrom. The binarization blocks are associated with respective unary modes. The SE data is binarized by each of the binarization blocks in parallel to provide multiple streams of binarized SE data. The binarizer further includes multiplexing circuitry for outputting the binarized SE data selected at least in part from the multiple streams of binarized SE data. The binarized SE data is selected for output from the multiplexing circuitry responsive to the mode select signal.

BRIEF DESCRIPTION OF THE DRAWINGS

Accompanying drawing(s) show exemplary embodiment(s) in accordance with one or more aspects of the invention; however, the accompanying drawing(s) should not be taken to limit the invention to the embodiment(s) shown, but are for explanation and understanding only.

FIG. 17A is a program listing depicting an exemplary embodiment of macroblock AFF initialization context values.

FIG. 17B is a program listing depicting an exemplary embodiment of a context initialization routine.

FIG. 19 is a code listing depicting a binary arithmetic encoding code listing of the prior art.

FIG. 20 is a program listing depicting an exemplary embodiment of a macro for writing bytes of code of the prior art.

DETAILED DESCRIPTION OF THE DRAWINGS

In the following description, numerous specific details are set forth to provide a more thorough description of the specific embodiments of the invention. It should be apparent, however, to one skilled in the art, that the invention may be practiced without all the specific details given below. In other instances, well known features have not been described in detail so as not to obscure the invention. For ease of illustration, the same number labels are used in different diagrams to refer to the same items; however, in alternative embodiments the items may be different.

Figure 1:
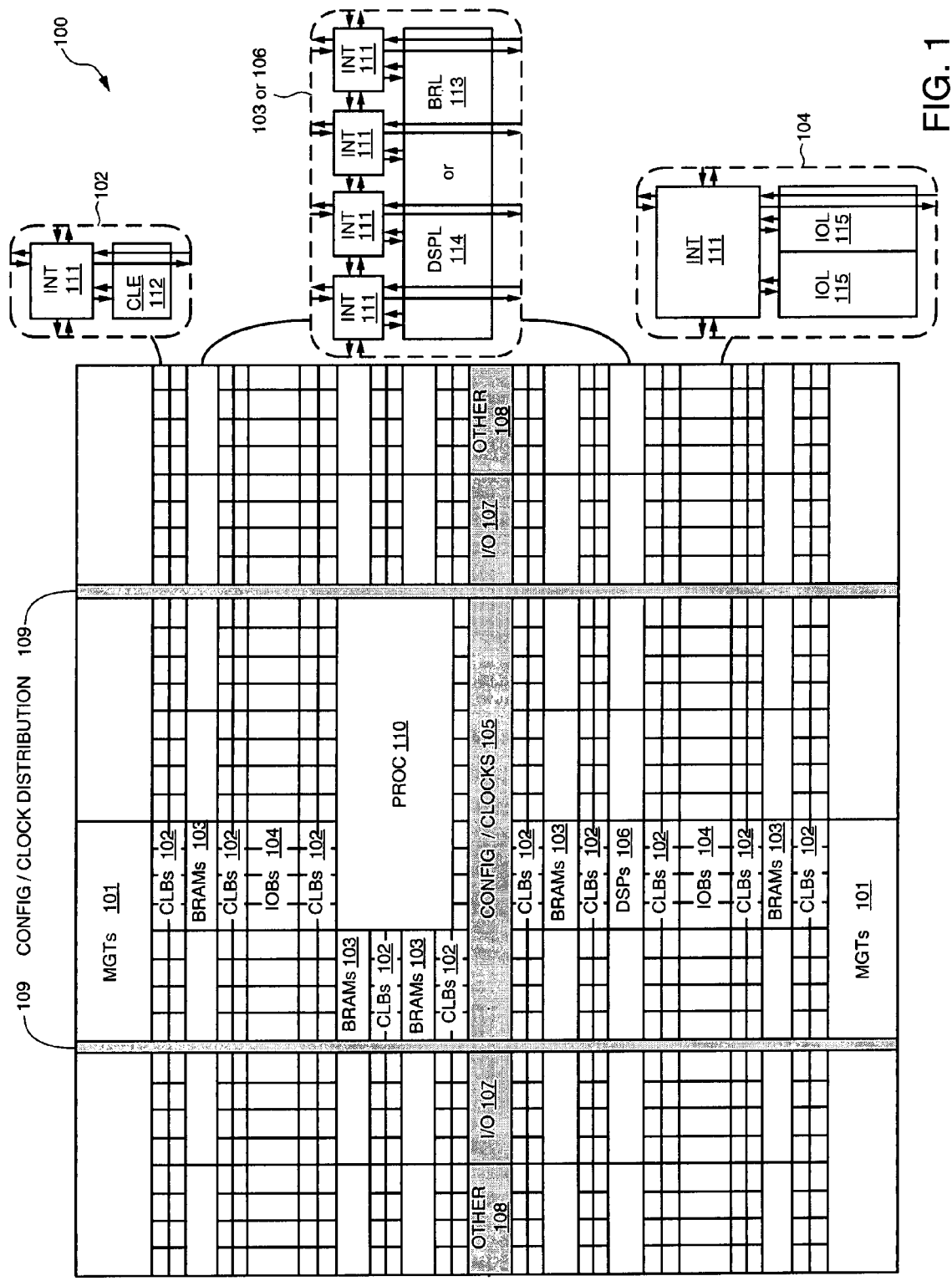
FIG. 1 is a simplified block diagram depicting an exemplary embodiment of a columnar Field Programmable Gate Array ("FPGA") architecture in which one or more aspects of the invention may be implemented.

FIG. 1 illustrates an FPGA architecture 100 that includes a large number of different programmable tiles including multi-gigabit transceivers ("MGTs") 101, configurable logic blocks ("CLBs") 102, random access memory blocks ("BRAMs") 103, input/output blocks ("IOBs") 104, configuration and clocking logic ("CONFIG/CLOCKS") 105, digital signal processing blocks ("DSPs") 106, specialized input/output ports ("I/O") 107 (e.g., configuration ports and clock ports), and other programmable logic 108 such as digital clock managers, analog-to-digital converters, system monitoring logic, and so forth. Some FPGAs also include dedicated processor blocks ("PROC") 110.

In some FPGAs, each programmable tile includes a programmable interconnect element ("INT") 111 having standardized connections to and from a corresponding interconnect element 111 in each adjacent tile. Therefore, the programmable interconnect elements 111 taken together implement the programmable interconnect structure for the illustrated FPGA. Each programmable interconnect element 111 also includes the connections to and from any other programmable logic element(s) within the same tile, as shown by the examples included at the right side of FIG. 1.

For example, a CLB 102 can include a configurable logic element ("CLE") 112 that can be programmed to implement user logic plus a single programmable interconnect element 111. A BRAM 103 can include a BRAM logic element ("BRL") 113 in addition to one or more programmable interconnect elements 111. Typically, the number of interconnect elements included in a tile depends on the height of the tile. In the pictured embodiment, a BRAM tile has the same height as four CLBs, but other numbers (e.g., five) can also be used. A DSP tile 106 can include a DSP logic element ("DSPL") 114 in addition to an appropriate number of programmable interconnect elements 111. An IOB 104 can include, for example, two instances of an input/output logic element ("IOL") 115 in addition to one instance of the programmable interconnect element 111. As will be clear to those of skill in the art, the actual I/O pads connected, for example, to the I/O logic element 115 are manufactured using metal layered above the various illustrated logic blocks, and typically are not confined to the area of the I/O logic element 115.

In the pictured embodiment, a columnar area near the center of the die (shown shaded in FIG. 1) is used for configuration, I/O, clock, and other control logic. Vertical areas 109 extending from this column are used to distribute the clocks and configuration signals across the breadth of the FPGA.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, the processor block 110 shown in FIG. 1 spans several columns of CLBs and BRAMs.

Note that FIG. 1 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the right side of FIG. 1 are purely exemplary. For example, in an actual FPGA more than one adjacent column of CLBs is typically included wherever the CLBs appear, to facilitate the efficient implementation of user logic. FPGA 100 illustratively represents a columnar architecture, though FPGAs of other architectures, such as ring architectures for example, may be used. FPGA 100 may be a Virtex™-4 or Virtex™-5 FPGA from Xilinx of San Jose, Calif.

Figure 2:
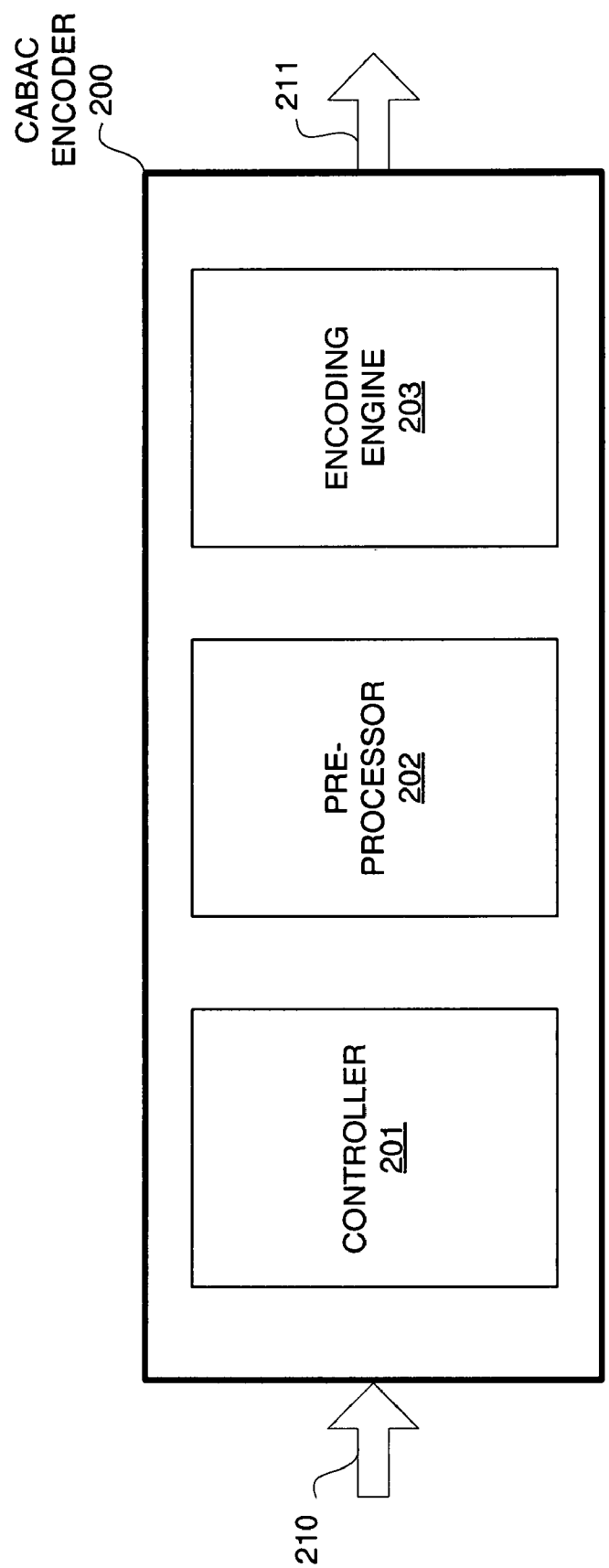
FIG. 2 is a block diagram depicting an exemplary embodiment of a context adaptive binary arithmetic coding ("CABAC") encoder system.

FIG. 2 is a block diagram depicting an exemplary embodiment of a context adaptive binary arithmetic coding ("CABAC") encoder system ("CABAC encoder") 200. CABAC encoder 200 is an entropy encoder which achieves compression by selecting probability models, adapting probability estimates, and using arithmetic coding. CABAC encoder 200 may be configured for fixed or adaptive context tables initialization. For example, during initialization of probability tables, CABAC encoder 200 may be configured for adaptive context table initialization. CABAC encoder 200 includes controller 201, preprocessor 202, and CABAC encoding engine 203. Input data 210 is provided to CABAC encoder 200, and CABAC encoder 200 encodes input data 210 to provide encoded data 211.

CABAC encoder 200 selects probability models for each Syntax Element ("SE") according to context of each such SE. Adaptive probability estimates are based on local statistics and arithmetic encoding by use of normalization or renormalization ("normalization"), which is described below in additional detail.

Encoding of data symbols involves various stages. In a binarization stage, non-binary symbols are binarized prior to arithmetic encoding. Another stage involves context model selection, where symbols to be encoded are grouped as SE types. Each SE type has its own context model for one or more "bins" of a binarized symbol. A binarizer maps the value of an SE into a binary sequence, where each bit of the binary sequence is called a "bin." A context model stores probability of each "bin". The probability of each "bin" is anywhere between 0 and 1, inclusive. For each "bin" of a binarized SE, a probability model is selected, such as from contexts memory or other context modeler. In this regard, a context model is selected based on local statistics of a binarized symbol.

The arithmetic encoding stage is for encoding a bin of a binarized symbol using a selected probability. The bin and its associated context model are passed to an arithmetic encoding stage. The probability update stage occurs after encoding a bin. Simply, after encoding a bin, a selected probability may be updated. Outputs from the arithmetic encoder are LOW and RANGE values. LOW and RANGE values may be generated by iterative division of a probability interval. When RANGE is too small to be represented by the number of bits available, namely bit width, both RANGE and LOW are brought into such bit width range by re-scaling through one or more bit shift operations. This re-scaling is referred to as "normalization" or "renormalization," both of which are referred to herein simply as "normalization" for purposes of clarity and not limitation. Bits shifted out from LOW and outstanding bits from the normalization in the arithmetic encoding stage are the compressed output data, which may then be packed into bytes.

CABAC encoder 200 may be implemented in an FPGA, such as FPGA 100 of FIG. 1. Moreover, CABAC encoder 200 may be implemented using an FPGA for what is known as "real-time" encoding. Furthermore, it shall be appreciated from the following description, that such an FPGA implementation may use parallelism to provide real-time encoding. CABAC encoder 200 may be implemented as a bit serial encoder or multi-bit parallel encoder, such as associated with Huffman type encoding. Furthermore, as shall be apparent from the following description, CABAC encoder 200 may be implemented without having to use one or more microprocessors. Moreover, it should be appreciated that microprocessors may have significant difficulty in achieving High-Definition ("HD") rates and that multi-bit parallel implementations of CABAC, such as Huffman type encoding, are presently extremely difficult to realize.

An efficient implementation of the ITU/ISO/IEC standard H.264/Advanced Video Coding ("AVC") for video compression ("H.264") that is capable of achieving high bandwidth is described below in additional detail. As shall become more apparent from the following description, the above-described bottlenecks associated with normalization and insertion of accumulated outstanding bits are removed, in part by using parallelism, and more particularly, parallelism achieved by implementation in an FPGA. Furthermore, context tables and probability updates may be stored internally in an FPGA, for instance in Block RAM of the FPGA, to eliminate the need for external memory. A High-Definition sequence profiling suggests that a one-bit-per-clock-cycle binary arithmetic coding would be useful. As described below in additional detail, single-clock-cycle normalization is provided where bits to be encoded, more particularly RANGE and LOW of such bits to be encoded, are ready in one clock cycle. Thus, with reference to FIG. 19, Erange and Elow, as generally indicated at 1911, may be ready in one clock cycle not just for loop 1922, but for all of listing 1900. In other words, Erange and Elow are ready in one clock cycle for a next symbol.

Furthermore, outstanding bit insertion is pipelined, as described below in additional detail, for insertion of outstanding bits outside a normalization loop. Rather, occurrences of outstanding bits are noted during normalization, and added back in later. In other words, it was observed that outstanding bits need not be processed during the more time sensitive normalization loop, but such processing of outstanding bits may be deferred.

Figure 3:
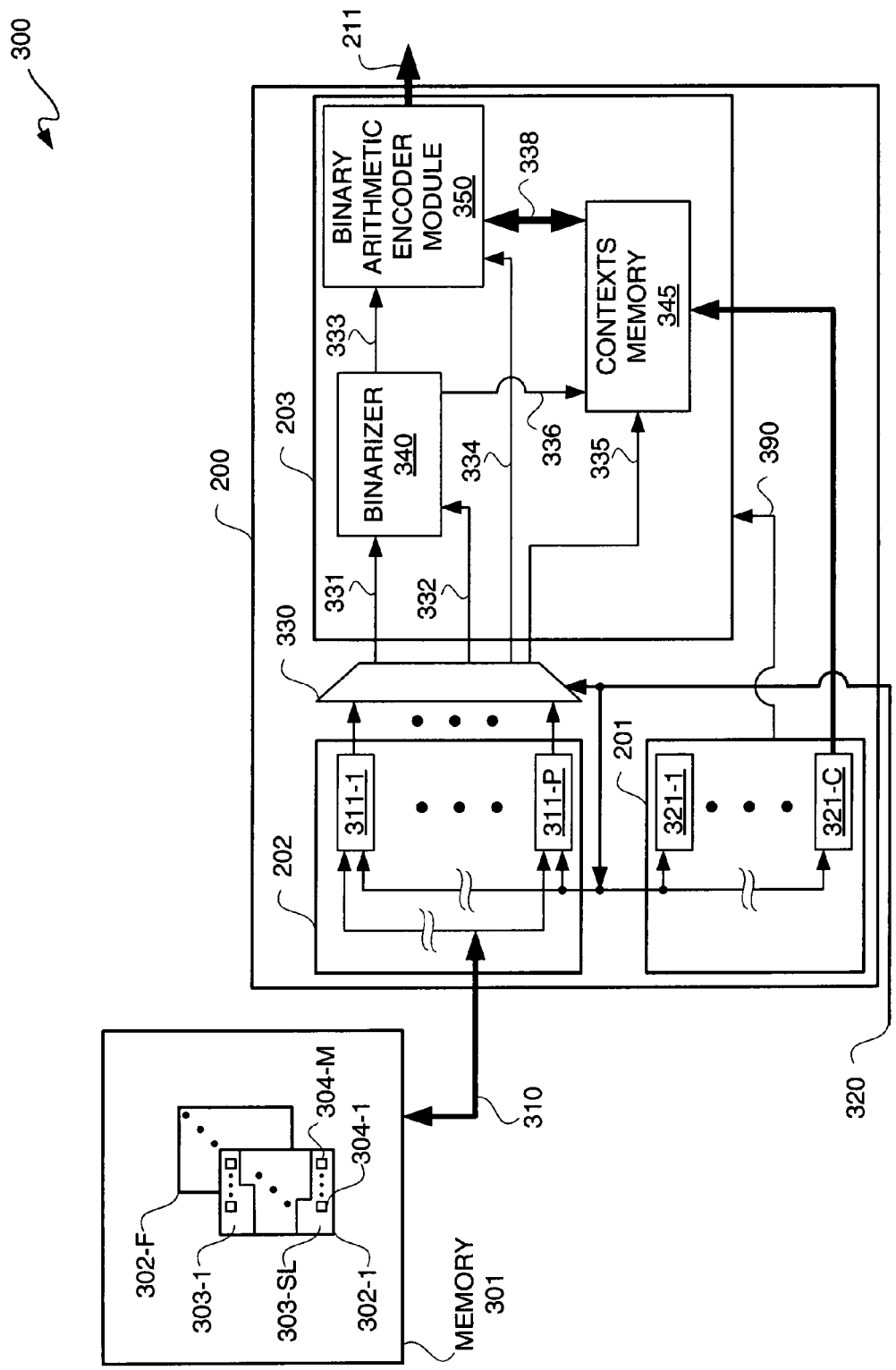
FIG. 3 is a block diagram depicting an exemplary embodiment of an encoding system including the CABAC encoder of FIG. 2.

FIG. 3 is a block diagram depicting an exemplary embodiment of an encoding system 300. Encoding system 300 includes CABAC encoder 200 of FIG. 2 coupled to memory 301. With continuing reference to FIG. 3 and renewed reference to FIG. 2, encoding system 300 is further described. Stored in memory 301 are one or more frames 302-1 through 302-F, for F a positive integer greater than one. In each frame of frames 302-1 through 302-F, there may be one or more slices 303-1 through 303-SL, for SL a positive integer greater than one. In each slice there may be one or more blocks 304-1 through 304-M, for M a positive integer greater than one. For H.264, blocks 304 are each 16-by-16 pixels. CABAC encoder 200 is not limited to frames, slices, or macroblocks. These are merely described for purposes of clarity by way of example and not limitation. Thus, it should be understood more generally that CABAC encoder 200 receives data for encoding, and such data is not limited for example to being in a macroblock of a slice of a frame, but may be any form of data suitable for CABAC encoding.

Memory 301 need not be directly connected to CABAC encoder 200. Rather, memory 301 may be part of a computer system in which CABAC encoder 200 is located, or CABAC encoder 200 may be located in a computer system coupled to a network. In the latter configuration, a computer system may be capable of obtaining a live stream of image information or stored content associated with access to a website, such as a website accessible via the Internet. Thus, as used herein memory 301 may be considered a "memory medium" which includes a non-volatile medium, e.g., a magnetic media or hard disk, or optical storage; a volatile medium, such as computer system memory, e.g., random access memory (RAM) such as DRAM, SRAM, EDO RAM, RAMBUS RAM, DR DRAM, etc.; or an installation medium, such as a CD-ROM or floppy disks, and which is computer readable. Thus, image information may be stored for loading into a computer system including CABAC encoder 200. However, the term "memory medium" may also include other known types of memory or combinations thereof. Furthermore, a network may be considered to be memory 301. For example, the Internet may be considered memory 301 from which image information may be obtained. Even a live streaming video feed is buffered within the context of transport over a network, and thus even a live streaming video feed sent over the Internet may be considered to be memory 301. Thus, memory 301 should be more generally considered as any known form of digital information storage capable of storing digital image information which may be read by a computer, or more particularly for the purposes herein read by CABAC encoder 200. Furthermore, it should be understood that CABAC encoder 200 need not be implemented in a computer system, but rather may be implemented in a variety of other types of devices associated with displaying digital video information. Some of these other types of devices include Personal Data Assistants ("PDAs"), smartphones, portable and stationary video players, portable and stationary gaming systems, and High-Definition ("HD") televisions, among other known types of devices capable of decoding image information for display.

Memory 301 may be a Random Access Memory ("RAM") in communication with CABAC encoder 200. For example, for an FPGA implementation of encoding system 300, BRAMs 103 may be used. More particularly, memory 301 may be in communication with SE preprocessor 202 for providing coefficient and structure fields 310 for a current macroblock of a current slice of a current frame being processed.

Controller 201 of CABAC encoder 200 may include circuits blocks 321-1 through 321-C, for C a positive integer greater than one. Controller 201 may be implemented as a state machine controller for providing control signals 390 to CABAC encoding engine 203.

SE preprocessor 202 of CABAC encoder 200 may include circuits blocks 311-1 through 311-P, for P a positive integer greater than one. Circuits blocks 311-1 through 311-P of SE preprocessor 202 are coupled memory 301 to receive respective coefficient and structure fields 310. Furthermore, circuit blocks 311-1 through 311-P and circuits blocks 321-1 through 321-C are respectively coupled to receive function select signaling 320. Additionally, function select signaling 320 is provided to multiplexer 330.

Outputs of circuit blocks 311-1 through 311-P are respectively provided as data inputs to multiplexer 330. Output of multiplexer 330 may include data input 331, select signaling 332, select signaling 334, and context address signaling ("context address") 335. Output of multiplexer 330 is selected from outputs of circuits blocks 311-1 through 311-P responsive to select signaling 320.

Controller 201 includes circuit block 321-C, which in this exemplary embodiment is a context management CABAC circuit block. Output of circuit block 321-C is provided as an input to contexts memory 345. Contexts memory 345 may be implemented using RAM.

CABAC encoding engine 203 of CABAC encoder 200 includes binarizer 340, binary arithmetic encoder module 350, and contexts memory 345. Data input 331 is provided to binarizer 340, and select signaling 332 is also provided to binarizer 340. Output of binarizer 340 is binary input 333, namely "bins," which is provided to binary arithmetic encoder module 350. The output mode of binarizer 340 is selected responsive to select signaling 332.

Binary arithmetic encoder module 350 encodes binary input 333 responsive to a context 338 obtained from contexts memory 345. Output of binary arithmetic encoder module 350 is encoded data 211, which may be subsequently output as bytes. For example, data output 211 may be a byte_out (7:0) form of output. However, it is not necessary that data output 211 be output as individual bytes, as other data lengths may be used.

Output of binary arithmetic encoder module 350 is selected responsive to select signaling 334, which is provided to binary arithmetic encoder module 350. In addition to receiving context address 335 by way of multiplexer 330, contexts memory 345 receives context address offset signaling ("context offset") 336 from binarizer 340. Accordingly, it should be appreciated that context 338 may be obtained from contexts memory 345, when accessed by binary arithmetic encoder module 350. This accessing of context memory 345 may involve address off-setting for obtaining a context 338.

Figure 4:
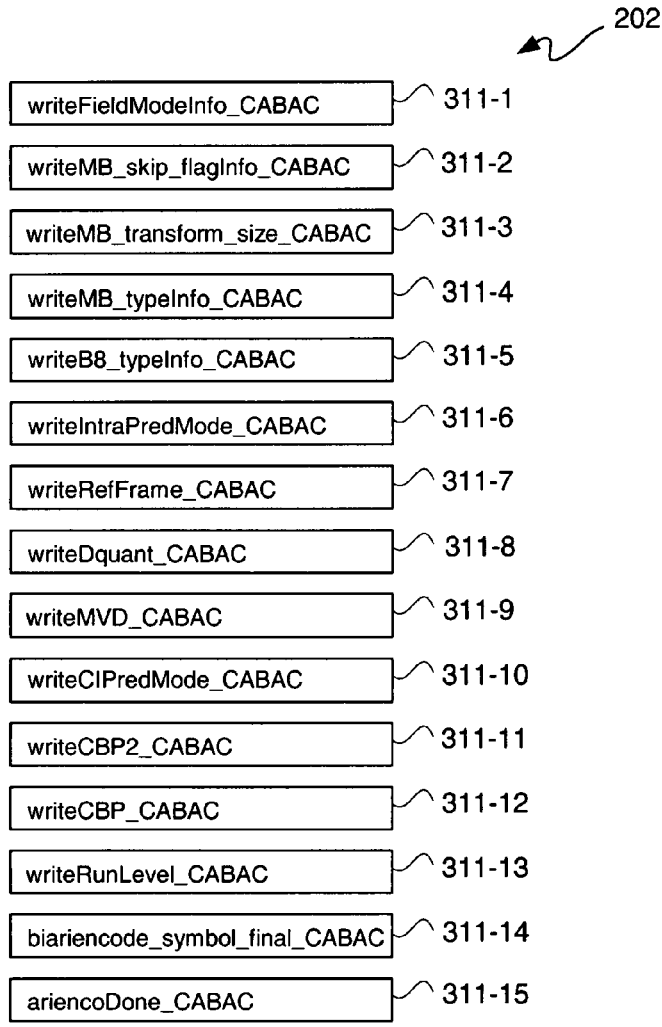
FIG. 4 is a block diagram depicting an exemplary embodiment of circuit blocks of a preprocessor of the CABAC encoder of FIGS. 2 and 3.

FIG. 4 is a block diagram depicting an exemplary embodiment of circuit blocks 311-1 through 311-P, for P equal to 15, of SE preprocessor 202 of FIGS. 2 and 3. Circuit blocks 311-1 through 311-13 are for CABAC encoding of a then current macroblock being processed. Circuit blocks 311-14 and 311-15 each process their respective SE type. The output of each of circuit blocks 311-14 and 311-15 is a non-binarized symbol to encode and a determination of the probability model to be used responsive to the context of the symbol. The term macroblock may be more generally thought of as a block, but the term "macroblock" is used herein for purposes of clarity by way of example and not limitation referring to H.264 blocks each of 16-by-16 pixels, where a macroblock is a section of a slice.

Circuit block 311-1 is for providing a field mode for an SE of a then current macroblock for instances of macroblock-based frame/field decision making. Circuit block 311-2 is for providing a macroblock skip flag for an SE. Circuit block 311-3 is for providing a macroblock intra-prediction size flag of a then current macroblock. Circuit block 311-4 is for providing a macroblock type header of a then current macroblock, namely the slice type. Circuit block 311-5 is for providing an eight pixel-by-eight pixel macroblock header information.

Circuit block 311-6 is to provide a pair of intra-prediction modes of a then current macroblock. Circuit block 311-7 is to provide a reference parameter of a then current macroblock.

Circuit block 311-8 is to provide a coded block pattern of a then current delta quantization. Circuit block 311-9 is for providing a motion vector data difference.

Circuit block 311-10 is for providing chroma for an intra-prediction mode of an eight pixel-by-eight pixel macroblock. Circuit blocks 311-11 and 311-12 are for providing a first and a second coded block pattern, respectively, of a then current macroblock being processed. Circuit block 311-13 is for providing Block-Transform Coefficients. By Block-Transform Coefficients for arithmetic encoding, it is generally meant that a write of significant coefficients, a write of a significance map, and a write and store of a coded block pattern ("CBP") block bit are performed.

Circuits blocks 311-14 and 311-15 are respectively for: identifying a final binary arithmetic symbol to be encoded for purposes of notifying binary arithmetic encoder module 350; and notifying binary arithmetic encoder module 350 that an arithmetic encoding may be completed for a then current macroblock.

Figure 5:
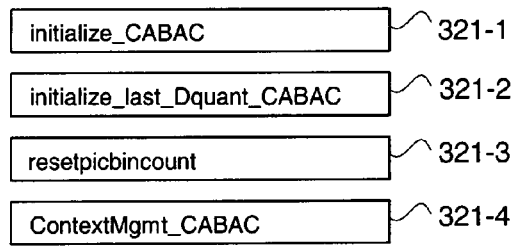
FIG. 5 is block diagram depicting an exemplary embodiment of circuit blocks of a controller of the CABAC encoder of FIGS. 2 and 3.

FIG. 5 is block diagram depicting an exemplary embodiment of circuit blocks 321-1 through 321-C, for C equal to four, of controller 201 of FIGS. 2 and 3. Circuit block 321-1 is for initializing CABAC encoding engine 203. Circuit block 321-2 is for initializing a last delta quantization for CABAC encoding engine 203. Circuit block 321-3 is to reset a picture "bin" count for CABAC encoding engine 203. Circuit block 321-4 is for context management of contexts in contexts memory 345.

It should be appreciated that image sequences may have multiple quantization parameters ("QPs"). Furthermore, it should be appreciated that image sequences may have multiple frames of various types. For MPEG, these frames are conventionally referred to as I-frames, P-frames, and B-frames. Additionally, the resolution of frames of an image sequence may be different among various sequences, as is known both with respect to the degree of resolution and the type of resolution, namely interleaved or progressive. Furthermore, the frame rate may be different among different image sequences. However, it should be appreciated that CABAC encoding engine 203 is capable of handling any of a variety of types of data, including any of the above types of data. Moreover, it should be appreciated that CABAC encoding engine 203 is capable of providing real-time encoding of High-Definition data.

It should be appreciated that the total number of "bins" to encode may be in the tens of millions, hundreds of millions, billions, or greater. Thus for example, for a total number of "bins" to encode of approximately 393,509,180, the total number of bits output by CABAC encoding engine 203 may be approximately 290,688,688 for an input-to-output compression ratio of 1.34. This numerical example, as well as all the numerical examples herein pertaining to H.264 video compression, are merely for purposes of clarity and not limitation, and it should be appreciated that other numerical values may be used.

Figure 6:
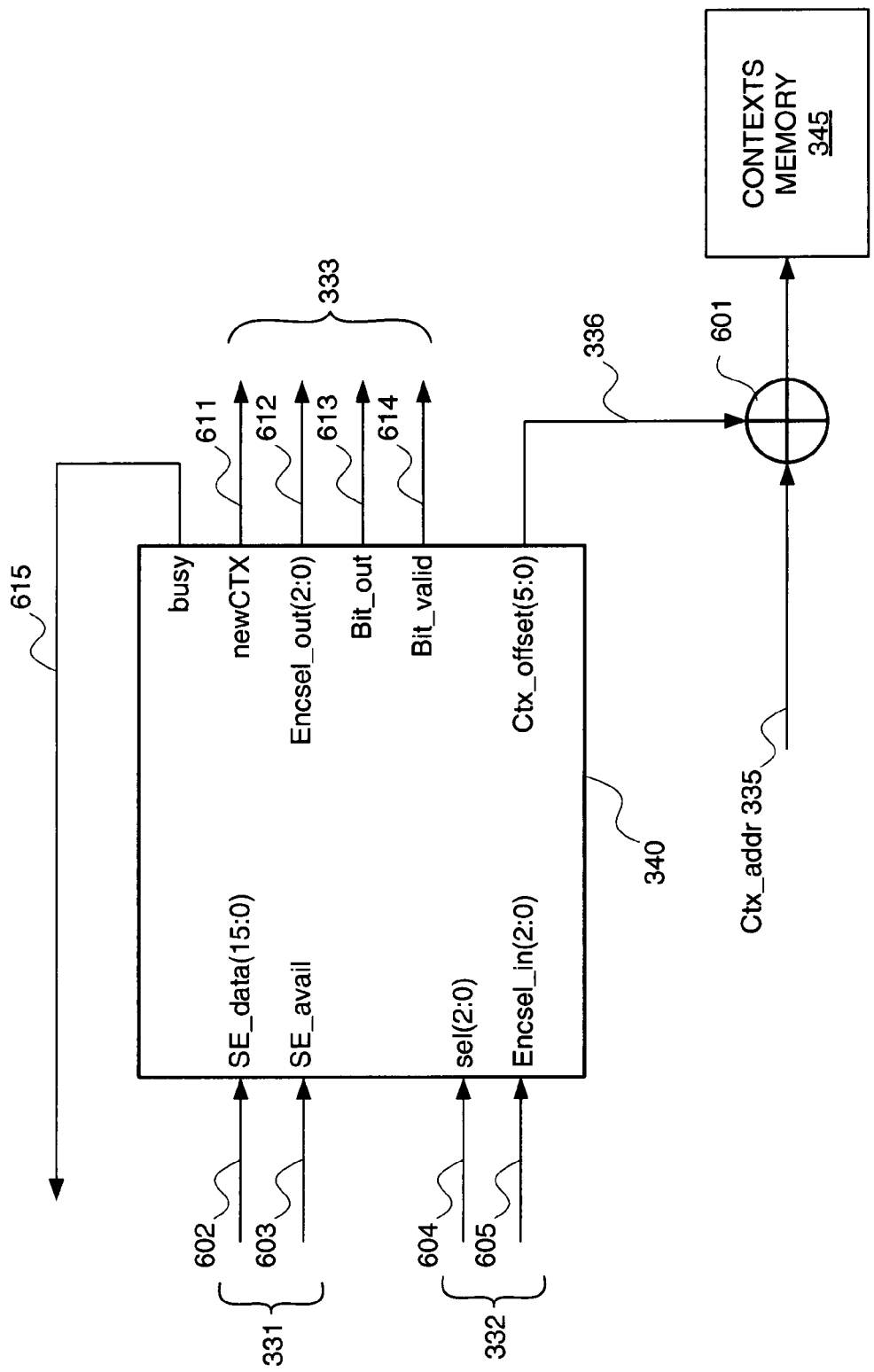
FIG. 6 is a block diagram depicting an exemplary embodiment of a binarizer of a CABAC encoding engine of the CABAC encoder of FIG. 2.

FIG. 6 is a block diagram depicting an exemplary embodiment of binarizer 340 of FIG. 3 coupled to contexts memory 345 of FIG. 3. With continuing reference to FIG. 6 and renewed reference to FIGS. 2 and 3, binarizer 340 is further described. Context address 335 is provided to adder 601. Context offset 336 is provided to adder 601 for addition with context address 335, and the result of such addition is provided to contexts memory 345. Adder 601 is not illustratively shown in FIGS. 2 and 3 for purposes of clarity.

Binarizer 340 receives SE data 602 and SE available signal 603, namely generally data input 331. Binarizer 340 further receives select signal 604 and enable code select signal input

605, namely generally select signaling 332. Responsive to such input as described below in additional detail, binarizer 340 is configured to provide new context signal 611, enable chip select output 612, bit output 613, and bit valid signal 614, collectively binary output 333. Additionally, binarizer 340 may be configured to provide a busy signal 615, which may be provided to SE preprocessor 202 and controller 201. If busy signal 615 is active, new inputs to binarizer 340 are ignored.

Binarization is used to reduce the alphabet size of SEs to a reduced binary alphabet, which may be a "maximally-reduced" binary alphabet. Using a reduced binary alphabet, binary input 333 may be an intermediate binary code word for an SE, which may be unique among SEs. Each SE has a corresponding context model. Each binary input, or bin, resulting from binarization of a code word may be associated with a context index value representing probability of such a binary input.

For binarizer 340, there may be one or more modes of binarization, which may be for different types of arithmetic encoding. For example, there may be a unary mode, a unary maximum length mode, a unary maximum plus exponent Golomb for run level encoding, and a unary maximum plus exponent Golomb for motion vector difference ("MVD") encoding.

For example, for an SE value x greater than zero to be encoded, a unary code word may be x number of logic 1 bits plus a terminating logic 0 bit. For example, a unary code word of six may equal the following bitstream: 1111110. Again, for an SE value x greater than zero to be encoded, a unary maximum code word may be defined only for when x is greater than or equal to zero and less than or equal to S. In this mode, a code word may consist of x number of logic 1 bits for x less than or equal to S. For example, if S is equal to ten, the unary max code word six is equal to the bitstream: 111111. MVD and run level SE encoding modes may employ a unary maximum length mode followed by exponential Golomb. Unary maximum is used for up to the pre-defined limit S, namely the prefix portion. If however, x is greater than S, than exponential Golomb binarization is applied to the difference, namely (x-S) or the suffix portion. The Golomb suffix portion is encoded using equiprobable context values.

For each binary input 333 produced by binarizer 340, an associated context model is produced from contexts memory 345, except for equiprobable symbols. Thus, for bin index generation by binarizer 340, namely the generation of context offset 336, the following rules may be used. For a unary mode, for encoding the reference parameter of a macroblock or for encoding the delta quantization factor of a macroblock, no context index offset for a first bin is used, and remaining binary inputs have an offset of logic +1, namely a bit shift of one. For a unary maximum mode for encoding chroma for an intra-prediction mode of an eight pixel-by-eight pixel block, no context index offset is used for a first binary input, and remaining bits have an offset of logic +1.

For a unary exponential mode for run-level encoding, to encode integer transform level coefficients, no context offsets in a unary prefix are used, and equiprobable context for a Golomb prefix is used. For a unary exponential mode for MVD encoding, for encoding of motion vectors difference values, a second bin has an offset of a logic +1, a third bin has an offset of logic +2, and a fourth bin has an offset of logic +3. Logic +2 and logic +3 respectively indicate a 2-bit shift operation namely a bit shift operation for shifting two bits, and a 3-bit shift operation.

For example, for select signal 604 being a 000, bypass binarization may be selected. In other words, SE data for 602 for example is already in a binary form, and thus binarization by binarizer 340 is bypassed. For select signal 604 being a 001, a unary binarization mode may be selected. For select signal 604 being a 010, a unary maximum length binarization mode may be selected. For select signal 604 being a 011, a unary maximum plus exponential Golomb binarization mode for run-level encoding may be selected. Lastly, for select signal 604 being a 100, a unary maximum plus exponential Golomb binarization mode for MVD encoding may be selected.

In this example, 16 bits of SE data signal 602, namely SE_data[15:0], is for an SE to encode. More than 16 bits may be implemented. SE available signal 603 is to indicate a valid new SE to encode. Encode select input signal 605 may instruct binary arithmetic encode module 350. For example, for encode select input signal 605 being a 000, binary arithmetic encoding of one binary symbol by using an associated probability estimate may be used. For encode select input signal 605 being a 001, binary arithmetic encoding of one binary symbol assuming a fixed probability distribution with probability a function of such symbol being equal to 0.5 for equiprobability. For encode select input signal 605 being a 010, binary arithmetic encoding of a last symbol before termination of an encoding may be indicated. For encode select input signal 605 being a 011 to indicate termination of an arithmetic codeword, a write stop bit may be asserted and stuffing bytes, if any, may be inserted. Lastly, for encode select input signal 605 being a 100 or a 101, disabling of encoding or initializing encoding, respectively, may be control inputs for binary arithmetic encode module 350.

New context signal 611 is to change a context. Non-assertion of new context signal 611 informs binary arithmetic encoder module 350 to reuse a previously updated context to save on incurring clock cycles, where such clock cycles may be incurred with respect to fetching a context from contexts memory 345. Encode select output 612 is merely encode select input signal 605 passed through binarizer 340. Bit output signal 613 indicates a binary input to encode. Bit valid signal 614 indicates a binary input to encode is valid. Context offset 336 indicates a context index offset for a binary input to encode, namely that of bit output signal 613, to obtain a context from contexts memory 345 associated with such bin. And as previously described, select signal 604 indicates the type of binarization performed, if any.

Figure 7:
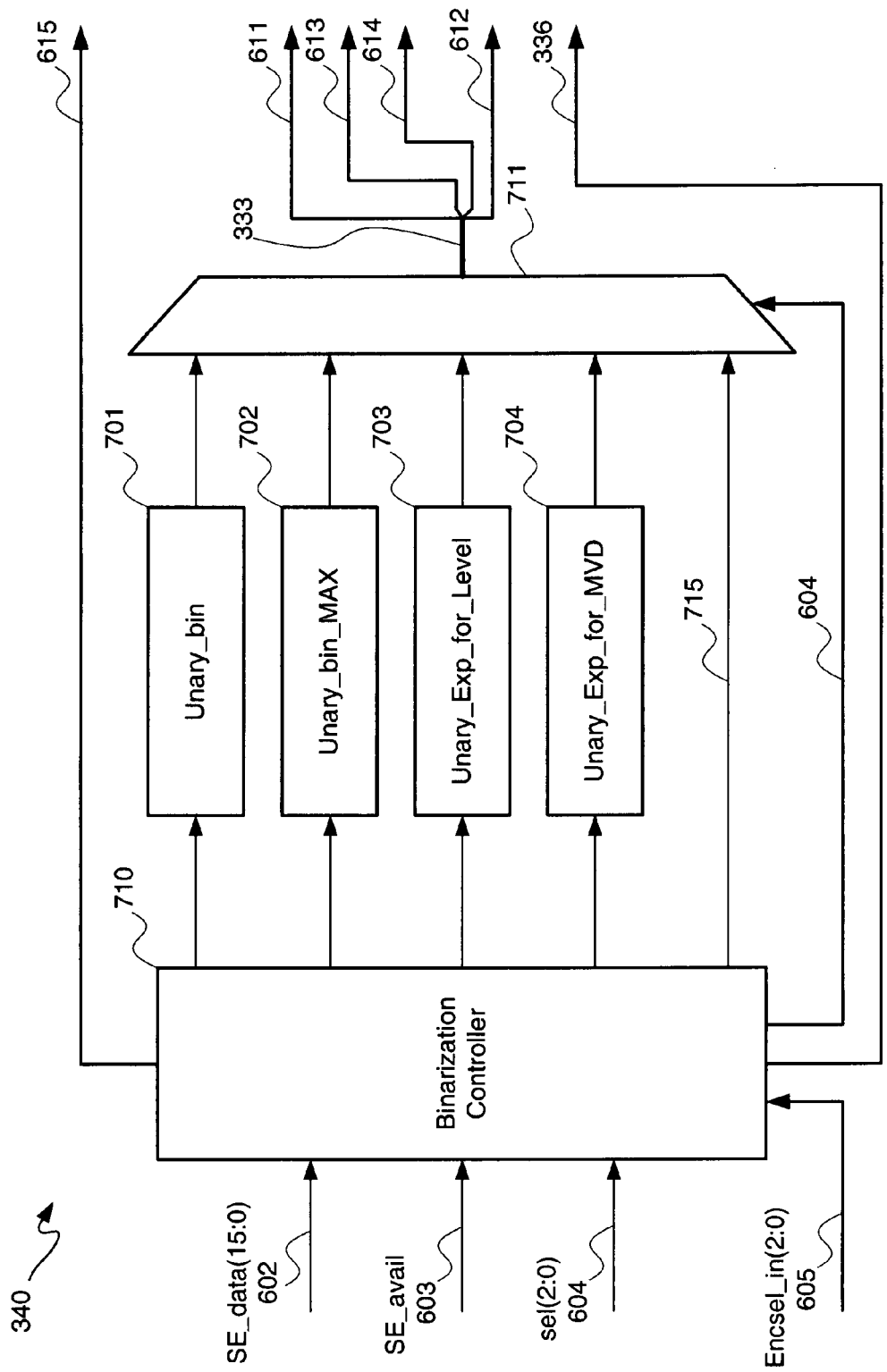
FIG. 7 is a block diagram depicting an exemplary embodiment of a binarizer.

FIG. 7 is a block diagram depicting an exemplary embodiment of binarizer 340 of FIGS. 3 and 6. With continuing reference to FIG. 7 and renewed reference to FIGS. 3 and 6, binarizer 340 is further described. Binarizer 340 includes binarization controller 710 and multiplexer 711, as well as mode blocks 701 through 704 coupled between binarization controller 710 and multiplexer 711. Additionally, path 715 from binarization controller 710 to a data input of multiplexer 711 indicates a bypass mode of binarizer 340. Select signal 604 is passed from binarization controller 710 to multiplexer 711 as a control select input. Signals 602, 603, and 605 are other inputs to binarization controller 710.

Outputs of binarization controller 710 are respectively provided to mode blocks 701 through 704, as well as to path 715. Outputs of mode blocks 701 through 704 are respectively provided as data inputs to multiplexer 711. Output of multiplexer 711 is binary input 333, as previously described. Mode blocks 701 through 704 respectively correspond to unary, unary maximum, unary exponential for run-level encoding, and unary exponential for MVD encoding, respectively, as previously described. Additionally, signals 615 and 336 are output from binarization controller 710.

Figure 8:
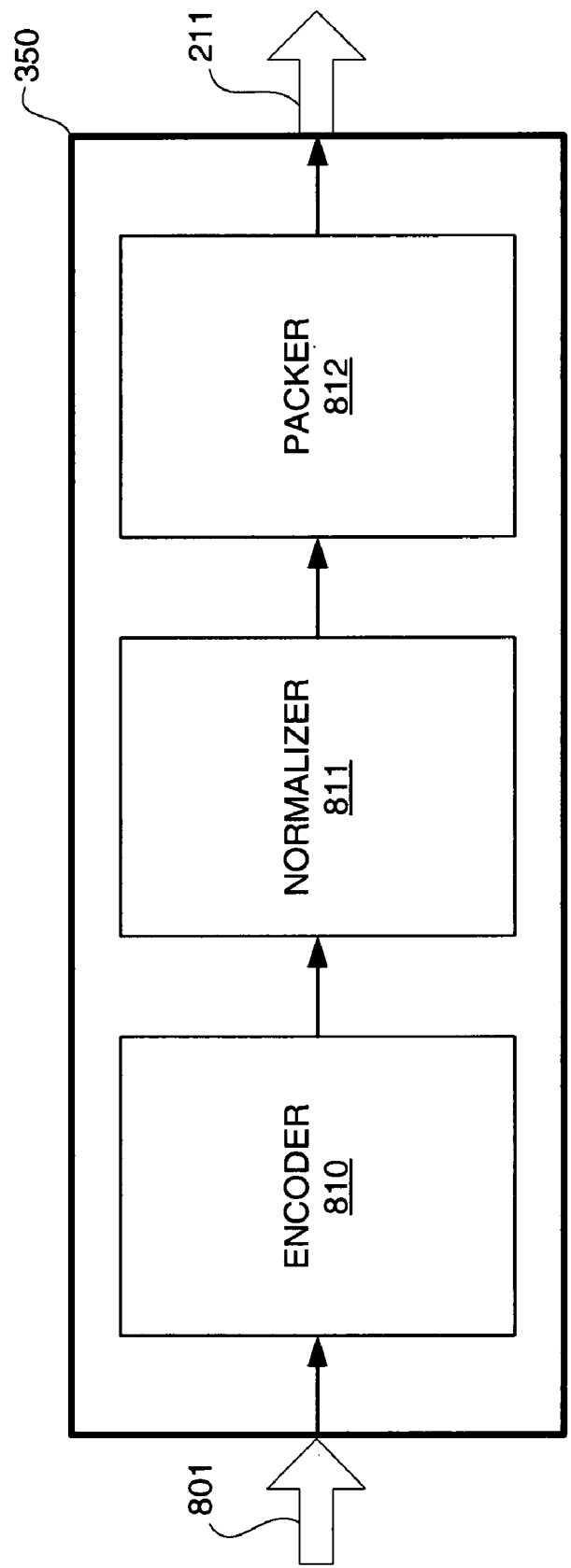
FIG. 8 is a block diagram depicting an exemplary embodiment of three functional blocks of a binary arithmetic encoder module.

FIG. 8 is a block diagram depicting an exemplary embodiment of three functional blocks of binary arithmetic encoder module 350 of FIG. 3. With continuing reference to FIG. 8 and renewed reference to FIG. 3, binary arithmetic encoder module 350 is further described. Input 801, namely context 338, select signaling 334, and binary input 333, is provided to binary arithmetic encoder module 350 for encoding. This encoding is a context binary arithmetic encoding, which is done by an adaptive binary encoder block 810. Output of binary encoder block 810 is provided to normalizer block 811. Normalizer block 811 is for normalizing RANGE and LOW when they are outside of a threshold bit width or length. Output of normalizer block 811 is provided to packer 812. Packer 812 for example may be a byte packer for packing both encoded bits as well as padding, when applicable.

Figure 9:
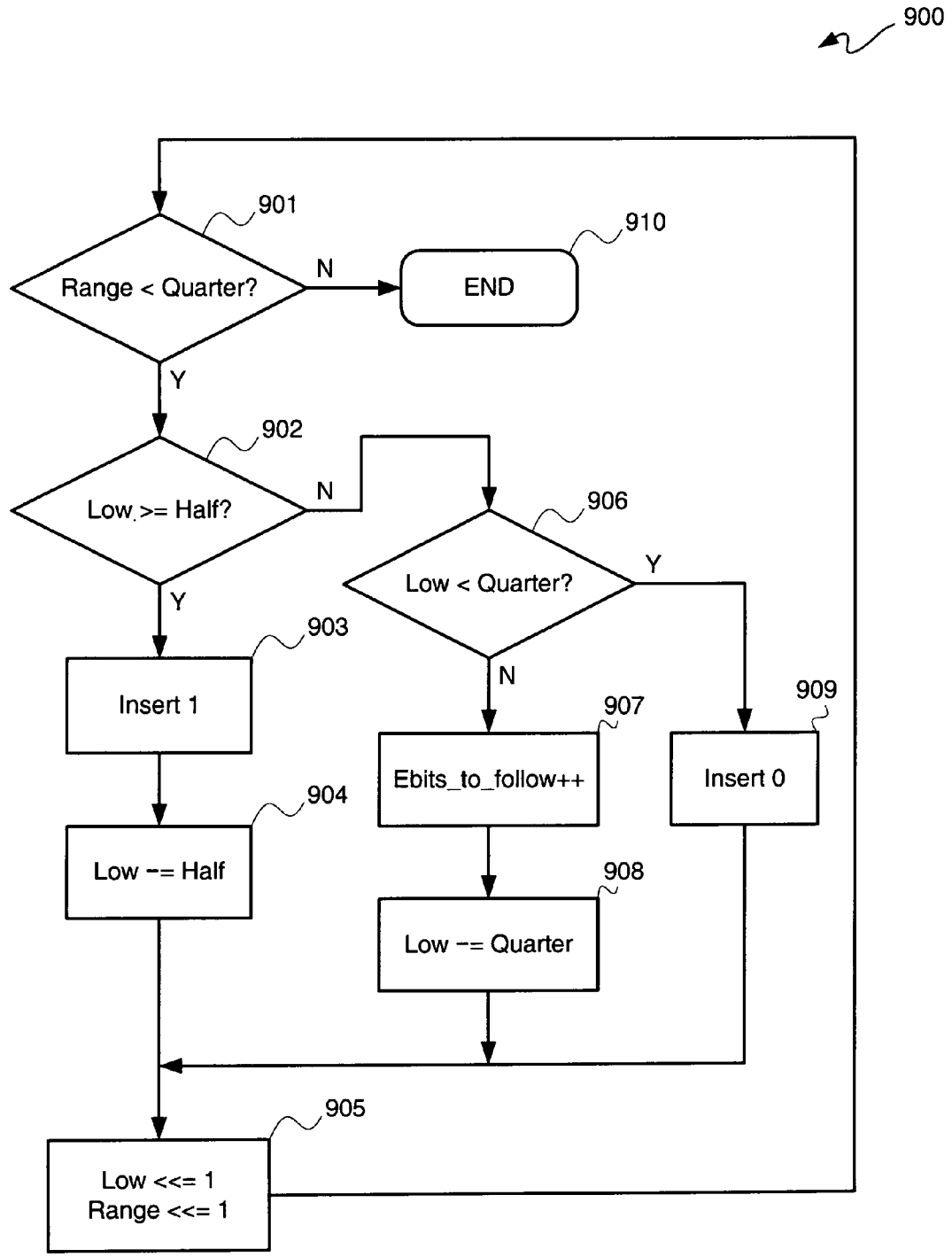
FIG. 9 is a state transition diagram depicting an exemplary embodiment of a one clock cycle normalization of a RANGE flow.

Prior to continuing, renewed reference to the previously described prior art may be helpful. FIG. 9 is a transition state diagram depicting an exemplary embodiment of a JM flow 900 as is known. With renewed reference to FIGS. 19 and 20, JM flow 900 is further described. The normalization function first checks to determine if RANGE is less than QUARTER as indicated at decision 901. In the first path, if RANGE is greater than or equal to QUARTER, then normalization is not initiated and loop 900 ends at 910. If however, RANGE is less than QUARTER then it is determined whether LOW is greater than or equal to HALF at 902. If LOW is greater than or equal to HALF as determined at 902, then in the second path a logic 1 bit is inserted into the encoded bitstream at 903. This bit insertion at 903 is done using macro 2000. At 904, LOW is updated where HALF is subtracted from LOW. At 905, JM flow 900 left shifts LOW and RANGE by one bit each. This shift is equivalent to multiplying each of LOW and RANGE by 2. JM flow 900 then returns to the start condition, where RANGE is again tested to determine if it is less than QUARTER at 901.

If however, LOW is not greater than or equal to HALF as determined at 902, then in the third path it is determined whether LOW is less than QUARTER at 906. If LOW is less than QUARTER as determined at 906, then a logic 0 bit is inserted into the encoded bitstream at 909. This bit insertion at 909 is done using macro 2000. Then, again at 905, JM flow 900 left shifts LOW and RANGE by one bit each. JM flow 900 then returns to the start condition, where RANGE is again tested to determine if it is less than QUARTER at 901.

If, however, low is greater than or equal to QUARTER as determined at 906, then Ebits_to_follow is incremented by 1 at 907 as part of the fourth path. The variable Ebits_to_follow is a count of the number of outstanding bits that are to be inserted immediately after the insertion of a logic 1 or a logic 0 bit in the second or third path, respectively. After Ebits_to_follow is incremented, QUARTER is subtracted from LOW at 908. JM flow 900 then left shifts LOW and RANGE by one bit at 905. Thus, it should be appreciated that RANGE may be doubled at each iteration of loop 900 for those paths having a bit shift at 905. JM flow 900 then returns to the start condition where RANGE is again tested to determine if it is less than QUARTER at 901.

Outstanding bits accumulations occur when LOW and HIGH are not separated by at least a QUARTER. The counter Ebits_to_follow keeps track of the total accumulated bits. Upon the first bit insertion of macro 2000, namely a "put_one_bit_plus_outstanding( )" macro, all accumulated bits are sequentially inserted and all have the same value which the bitwise complement of the original bit inserted by the "put_one_bit_plus_outstanding( )" macro.

Having this understanding of JM flow 900, JM flow 900 may be improved by using a leading zero detection circuit. The leading zero detection circuit may be used to detect the number of left most extra zero bits associated with a difference between RANGE and QUARTER. Furthermore, such a leading zero detection circuit may further predetermine the number of iterations ("NUM_ITER"), such as would have been run through JM flow 900. Such a leading zero detection circuit may be implemented in an FPGA using look-up tables.

In the following description, nested loop JM flow 900 is effectively unrolled and the outstanding bit insertions are separated out from JM flow 900. In the following description, normalizations of RANGE and LOW are implemented as parallel processes with insertion of outstanding bits being separated from normalization. Each iteration which would have been through JM flow 900 is now represented by the number of iterations or NUM_ITER as a function of RANGE. The number of iterations as a function of RANGE may be determined from the number of leading zeros, which is a function of the difference between QUARTER and RANGE, after complementing the result of the subtraction. The result of the complement is processed to determine the number of leading zeros. The number of leading zeros may be looked up in a look-up table to determine the value of NUM_ITER as a function of RANGE. In other words, the number of iterations, namely the number of times JM flow 900 would have to be cycled, is determined in advance. This advance determination, along with separating out processing of outstanding bits from normalization, allows parallelization as described below in additional detail, where an output is picked responsive to a predetermined value of NUM_ITER.

From the following description it should be appreciated that the maximum value of NUM_ITER for a JM instantiation is seven. However, this means that there are eight possible outcomes for NUM_ITER, namely from zero to seven. If NUM_ITER is zero, this means that normalization is bypassed because RANGE is within the bounds of a data bit width or length. This is just one numerical example for purposes of clarity, and other values may be used.

It should also be appreciated from the following description that probabilities are updated and contexts are switched both within a single clock cycle. Moreover, within this same single clock cycle, normalization is performed. Thus, probabilities are updated and normalization is completed before the arrival of a next symbol to encode during a next clock cycle. Furthermore, insertion of outstanding bits, which is separated out from normalization, is pipelined. For an FPGA implementation, adders or subtractors with fast carry logic may be used.

Figure 10:
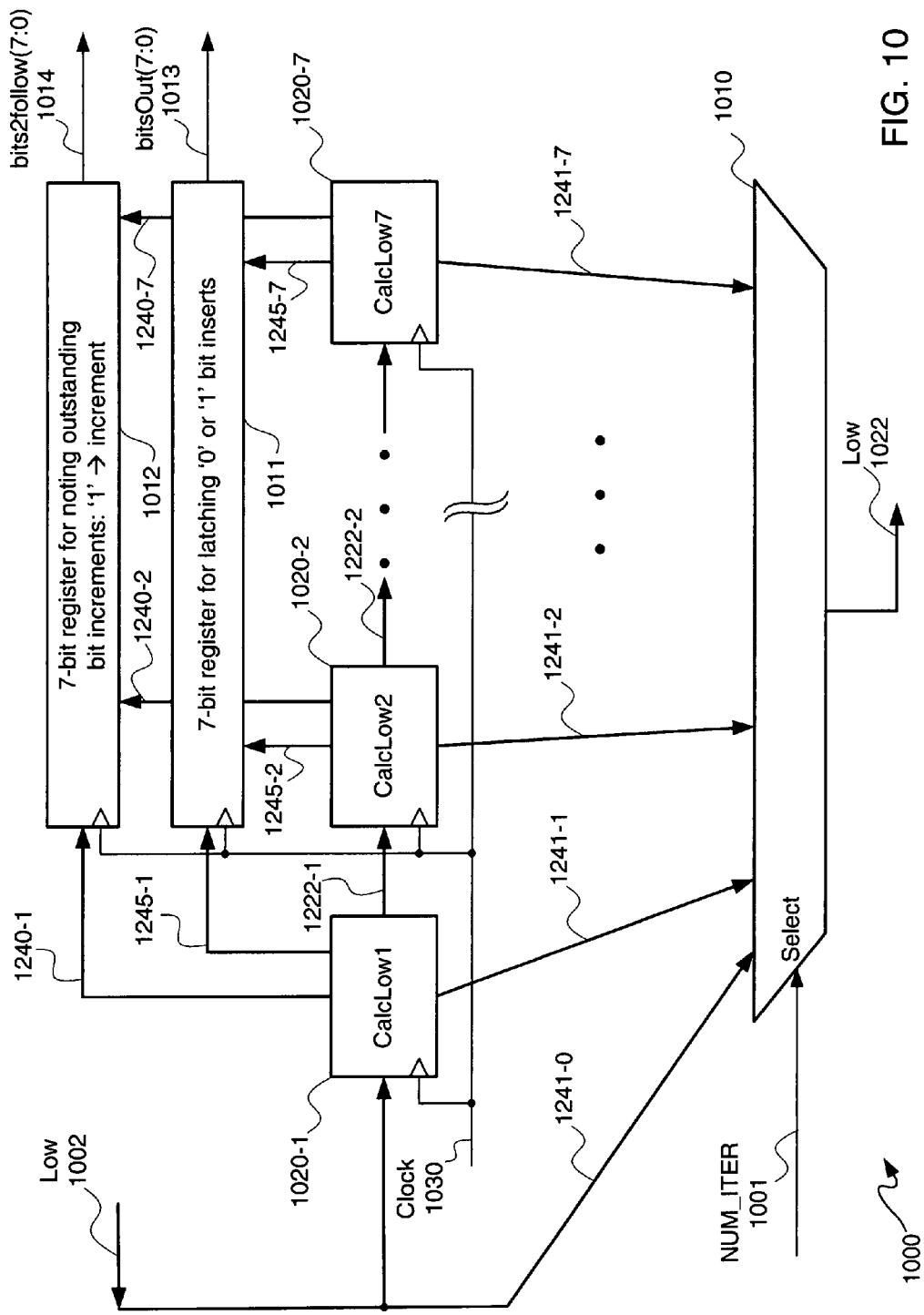
FIG. 10 is a block/circuit diagram depicting an exemplary embodiment of a normalization circuit.

FIG. 10 is a block/circuit diagram depicting an exemplary embodiment of LOW normalization circuit 1000. LOW normalization circuit 1000 may be used to implement normalizer 811 of FIG. 8. NUM_ITER 1001 is provided as a control/select input to multiplexer 1010. Specific numerical examples are provided for purposes of clarity by way of example and not limitation.

In this example, the maximum iteration number is 7 during normalization and thus JM flow 900 described above is unrolled into 7 parallel circuits. Such a parallel structure where each of the 7 iterative instances are computed at generally the same time may be implemented, such as by instantiation in programmable logic of an FPGA.

LOW 1002 is input to a data port of multiplexer 1010 and to a data port of calculation LOW block 1020-1. Calculation LOW ("CalcLow") blocks 1020-1 through 1020-7 are coupled in series such that the output of one block is provided as an input to another block. The last block, namely calculation LOW block 1020-7, does not feed forward its output as an input in the series of these blocks.

LOW 1002 and output of each of calculation LOW blocks 1020-1 through 1020-7 are provided as respective data inputs, namely LOW(n) outputs 1241-1 through 1241-7, to multiplexer 1010. Thus, responsive to NUM_ITER 1001, multiplexer 1010 provides LOW 1022 as output. Additionally, as described below in additional detail with respect to FIG. 12, outputs from each of calculation LOW blocks 1020-1 through 1020-7, namely insert bits signals 1245-1 through 1245-7, are respectively provided to a 7-bit register 1011 for latching bit inserts that are either a logic 0 or 1 bit for each of calculation LOW blocks 1020-1 through 1020-7. Register 1011 is for marking where to insert logic 0 or 1 bits and latching associated values, which facilitates decoupling of LOW normalization and outstanding bit insertion.

Figure 12:
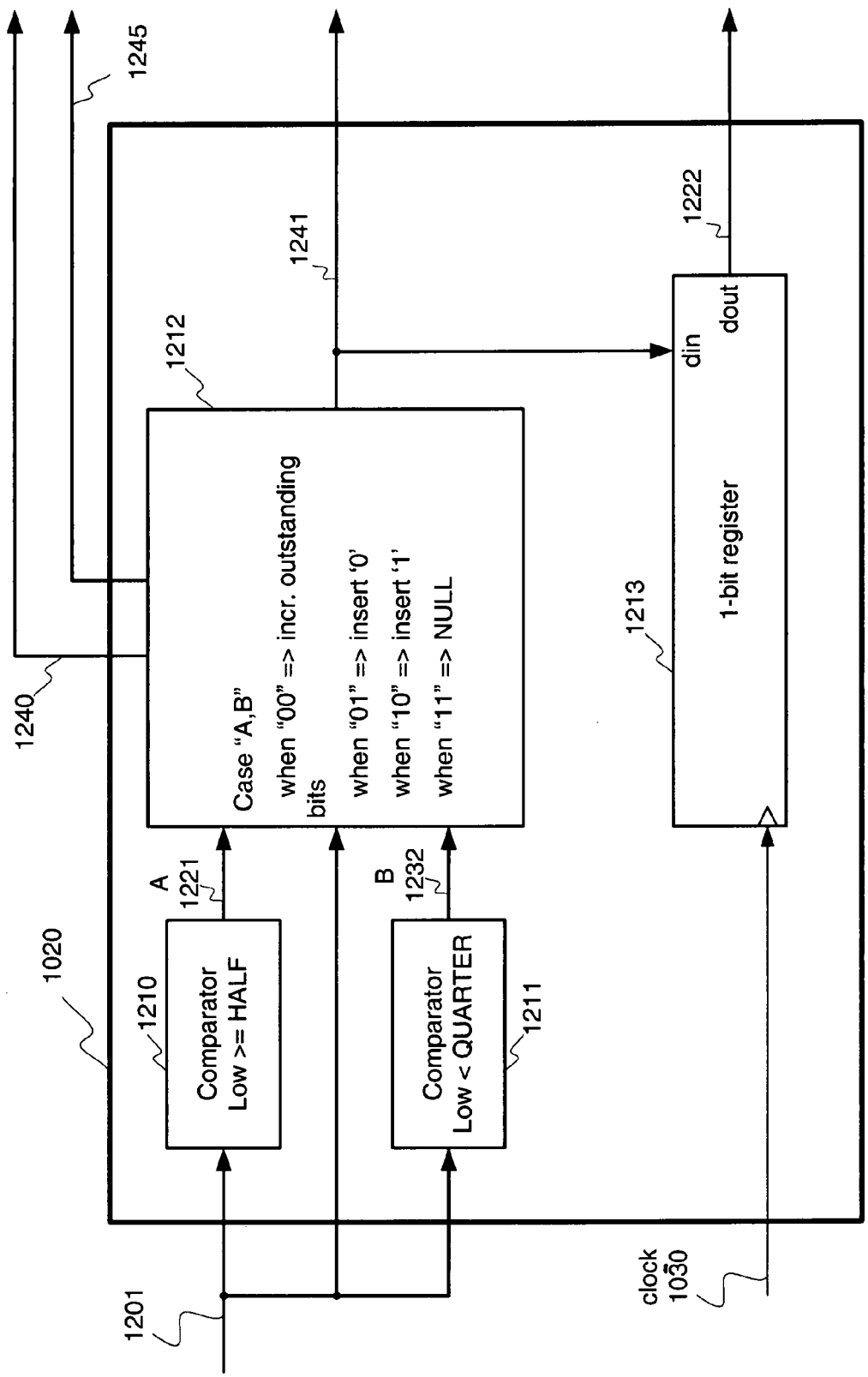
FIG. 12, is a block diagram depicting an exemplary embodiment of a calculation LOW block.

Furthermore, outputs from each of calculation LOW blocks 1020-1 through 1020-7, namely increment outstanding bit signals 1240-1 through 1240-7 as described below in additional detail with respect to FIG. 12, are respectively provided as inputs to a 7-bit register 1012 for noting outstanding bit increments, where a logic 1 indicates an increment. Register 1012 is used to mark where an outstanding bit counter, which may be thought of as Ebits_to_follow, is to be incremented.

Output of register 1011 is bits output 1013 (bitsOut(7:0)), and output of register 1012 is bits2follow output 1014, both of which are described additionally below. Bits2follow(7:0) in this example embodiment is a parallel 8 bit wide value where each bit represents one of the CalcLow blocks 1020-1 through 1020-7 and where an Ebits_to_follow counter is to be incremented. Based on the value of NUM_ITER, the first NUM_ITER number of CalcLow blocks may be used in the increment of the Ebits_to_follow counter, as described below in additional detail. Bits output 1013, namely bitsOut(7:0), likewise is a parallel 8 bit wide output, where a logic '1' bit output 1013 instructs adding a bit (logic '1' or '0') to the output encoding bitstream. Each bit of bitsOut(7:0) represents one of the CalcLow blocks 1020-1 through 1020-7 where the bit is to be inserted into the output stream.

Each of calculation LOW blocks 1020-1 through 1020-7 may execute any of the three functions performed during the normalization of LOW. All calculation LOW blocks 1020-1 through 1020-7 work in parallel and are also coupled in series such that output of one block is provided as an input to another block, namely in this example LOW(n) (where n goes from 1 to 7) clocked outputs 1222-1 through 1222-6 are respectively provided to calculation LOW blocks 1020-2 through 1020-7. For example, calculation LOW block 1020-1 transmits its update of LOW as LOW(1) clocked output 1222-1. Each subsequent calculation LOW block 1020-2 through 1020-6 transmits to the block illustratively shown on its right, its respective update of LOW based upon the value of LOW that it receives from the previous block. In other words, calculation LOW block 1020-1 obtains LOW input 1002 directly from a probability update block 2300 of FIG. 23, which is described below in additional detail with respect to FIG. 23. Each calculation LOW block 1020-1 through 1020-6 passes its update of LOW, namely LOW(n) clocked outputs 1222-1 through 1222-6 as described below in additional detail, to the subsequent calculation LOW block 1020-2 through 1020-7, respectively. Clock signal 1030 is used to clock each of the 1-bit registers, such as register 1213 of FIG. 12, of calculation LOW blocks 1020-2 through 1020-7, for a synchronous shift operation thereof. In each of calculation LOW blocks 1020-1 through 1020-7, the unregistered update of LOW is output as LOW(n) outputs 1241-1 through 1241-7, to input ports of an 8×1 multiplexer, namely multiplexer 1010.

In FIG. 10, a 7-bit register, namely register 1011, is used to latch the insertion of a logic '0' or '1' bit into the encoding stream during a normalization process. In the architecture of FIG. 10, it is not possible to know when and where these insertions occur without another indicator to more completely describe the happenings within an iteration of a normalization loop. This other indicator, namely register 1012, helps determine which of calculation LOW blocks 1020-1 through 1020-7 can validly insert a bit.

Generally, it may be noted that the insertion of bits and the incrementing of the outstanding bit counter are two mutually exclusive activities. It should be appreciated that normalization has two mutually exclusive sub-sections: one for bit insertion and the other for incrementing outstanding bits. The last section is considered a default mode of a normalization loop, because LOW fails both previous tests. In this default mode, insertion of a bit is not allowed. Thus, it may be determined which of calculation LOW blocks 1020-1 through 1020-7 may be allowed to insert a bit into the bitstream.

Figure 11:
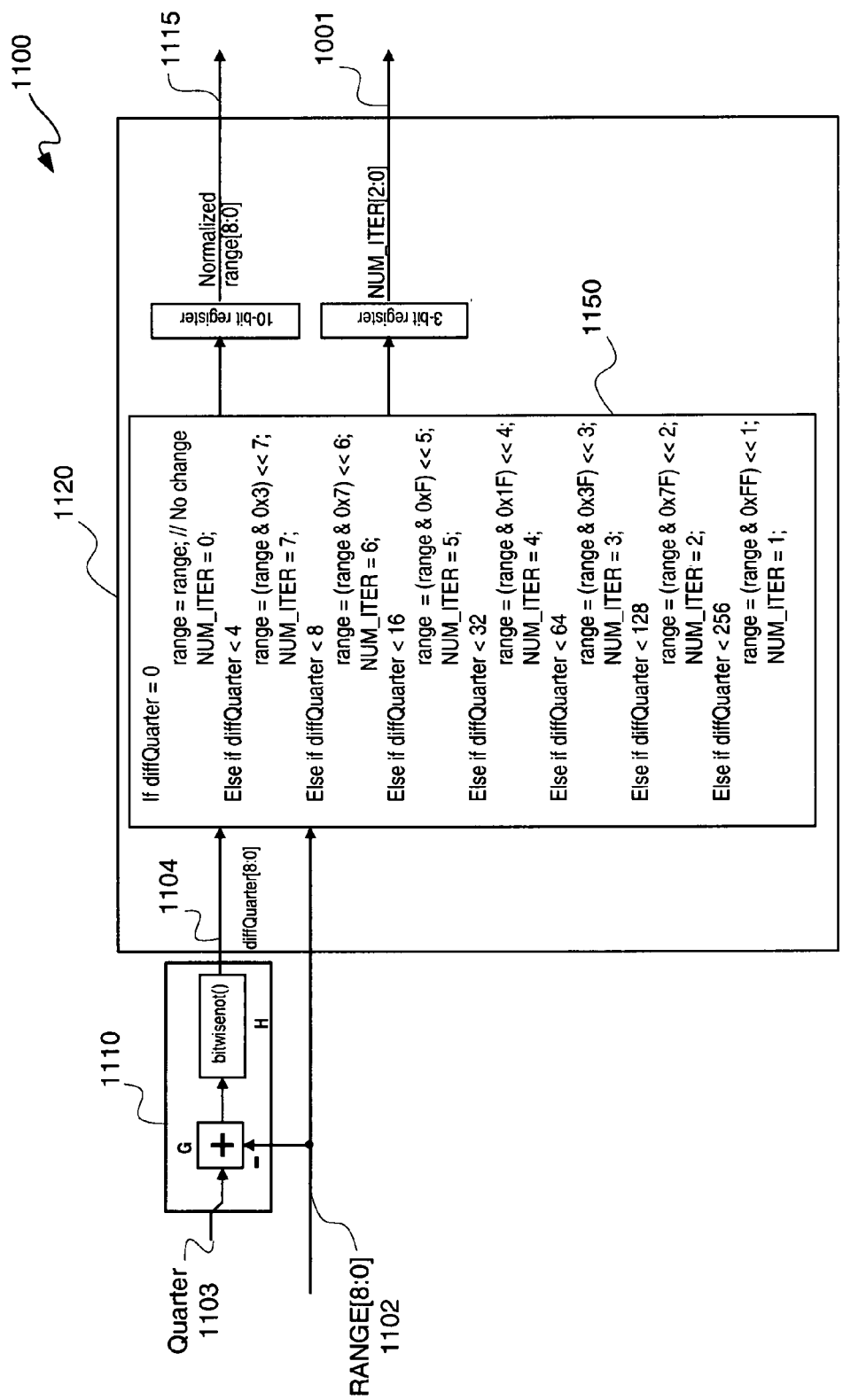
FIG. 11 is a block diagram depicting an exemplary embodiment of a NUM_ITER generation circuit.

FIG. 11 is a block diagram depicting an exemplary embodiment of a NUM_ITER generation circuit 1100. NUM_ITER generation circuit 1100 includes leading zero detector 1110 and look-up table ("LUT") 1120. Pseudo-code 1150 with specific numerical examples is provided for LUT 1120 for purposes of clarity by way of example and not limitation.

RANGE 1102 and QUARTER 1103 are input to leading zero detector 1110. It should be appreciated that RANGE is the absolute value of the difference between HIGH and LOW. Thus, by subtracting RANGE 1102 from QUARTER 1103 and taking the complement of the result, leading zero detector 1110 produces a number of leading zeros 1104. Responsive to number of leading zeros 1104, LUT 1120 produces NUM_ITER 1001 and normalized RANGE 1115.

With renewed reference to FIG. 10, multiplexer 1010 is controlled through the value of NUM_ITER 1001. Examples of selections are as follows: NUM_ITER equal to 0, then no normalization for LOW; NUM_ITER equal to 1, then only one iteration to normalize LOW so select output of calculation LOW block 1020-1; NUM_ITER equal to 2, then two iterations to normalize LOW so select output of calculation LOW block 1020-2; NUM_ITER equal to 3, then three iterations to normalize LOW so select output of calculation LOW block 1020-3; NUM_ITER equal to 4, then four iterations to normalize LOW so select output of calculation LOW block 1020-4; NUM_ITER equal to 5, then five iterations to normalize LOW so select output of calculation LOW block 1020-5; NUM_ITER equal to 6, then six iterations to normalize LOW so select output of calculation LOW block 1020-6; and NUM_ITER equal to 7, then seven iterations to normalize LOW so select output of calculation LOW block 1020-7.

Referring to FIG. 12, there is shown a block diagram depicting an exemplary embodiment of a calculation LOW block 1020 of LOW normalization circuit 1000 of FIG. 10. With reference to both FIGS. 10 and 12, calculation LOW block 1020 is further described. LOW input 1201 may be LOW input 1002 or any of the LOW outputs of registers of any of calculation LOW blocks 1020-1 through 1020-(n−1), namely LOW output 1222 for a calculation low block not being a final calculation LOW block of a series.

LOW input 1201 is provided to comparator blocks 1210 and 1211, as well as to combinatorial logic block 1212. It should be appreciated that comparator blocks 1210 and 1211 and combinatorial logic block 1212 form a combinatorial logic path of calculation LOW block 1020, whereas 1-bit register 1213, which receives clock signal 1030 to a clock port thereof, is part of a clocked path of calculation LOW block 1020.

Comparator 1210 is configured to determine whether LOW of LOW input 1201 is greater than or equal to HALF. An A output 1221 is provided from comparator 1210 to combinatorial logic 1212 indicating the result of such comparison. For A equal to a logic 0, it means that LOW was less than HALF, and for A equal to a logic 1, means that LOW was greater than or equal to HALF.

Comparator 1211 determines whether LOW of LOW input 1201 is less than QUARTER. Output of comparator 1211 is B output 1232 and is provided to combinatorial logic 1212. For LOW being less than QUARTER, B output 1232 is a logic 1, and for LOW being greater than or equal to QUARTER, B output 1232 is a logic 0.

A output 1221 and B output 1232 are input to LUT 1212 of FIG. 12, that determines whether to take one of three actions: to increment the number of outstanding bits; to insert a logic '0' into the bitstream; or, finally, to insert a logic '1' into the bitstream. This determination is represented by three concatenated values of A output 1221 and B output 1232, namely AB output equal to logic "00," "01," or "10". For the case of concatenated AB logic "11," no normalization is performed inside the CalcLow block.

Thus, for both A and B being logic 0s, outstanding bits are incremented, and accordingly, increment outstanding bit signal 1240 is provided to register 1012. For A and B respectively being a logic 0 and a logic 1, a logic 0 is inserted. For A and B respectively being a logic 1 and a logic 0, a logic 1 is inserted. Thus, these insertions are made to the value of LOW obtained from LOW input 1201 for purposes of providing LOW output 1241. Additionally, for A and B equal to 0,1 or 1,0, inserted bits are marked by assertion of insert bits signal 1245 as provided to register 1011 of LOW normalization circuit 1000.

Combinatorial logic 1212 is used for providing signals 1240, 1241, and 1245. Furthermore, for A and B equal to 1,1, this is a null condition, and thus none of signals 1241, 1240, or 1245 are output from combinatorial logic 1212. Furthermore, it is noted that LOW output 1241 is provided to a data input port of 1-bit register 1213, and responsive to a next clock cycle of clock 1030, such LOW output 1241 is provided as LOW output 1222, such as for a next calculation LOW block, except as indicated above for a final calculation block.

For the case where output A 1221 and output B 1232 are both logic 1s, namely the null case, neither of signal 1240 nor 1245 is asserted; however, LOW output 1241 is still provided, where combinatorial logic 1212 is configured in this condition to pass LOW input 1201 through to provide LOW output 1241.

It should be appreciated that on a single clock cycle, LOW input 1002 provided to an initial calculation LOW block 1020-1 is propagated through calculation LOW block 1020-7 with respect to a combinatorial logic path. However, it should be appreciated that because encoding is iterative, some of this data is registered, such as in respective 1-bit registers 1213 for subsequent bit encodings. Thus, it should be appreciated that all bits input to multiplexer 1010 are input and an output is selected therefrom within a single clock cycle of clock signal 1030.

Figure 13:
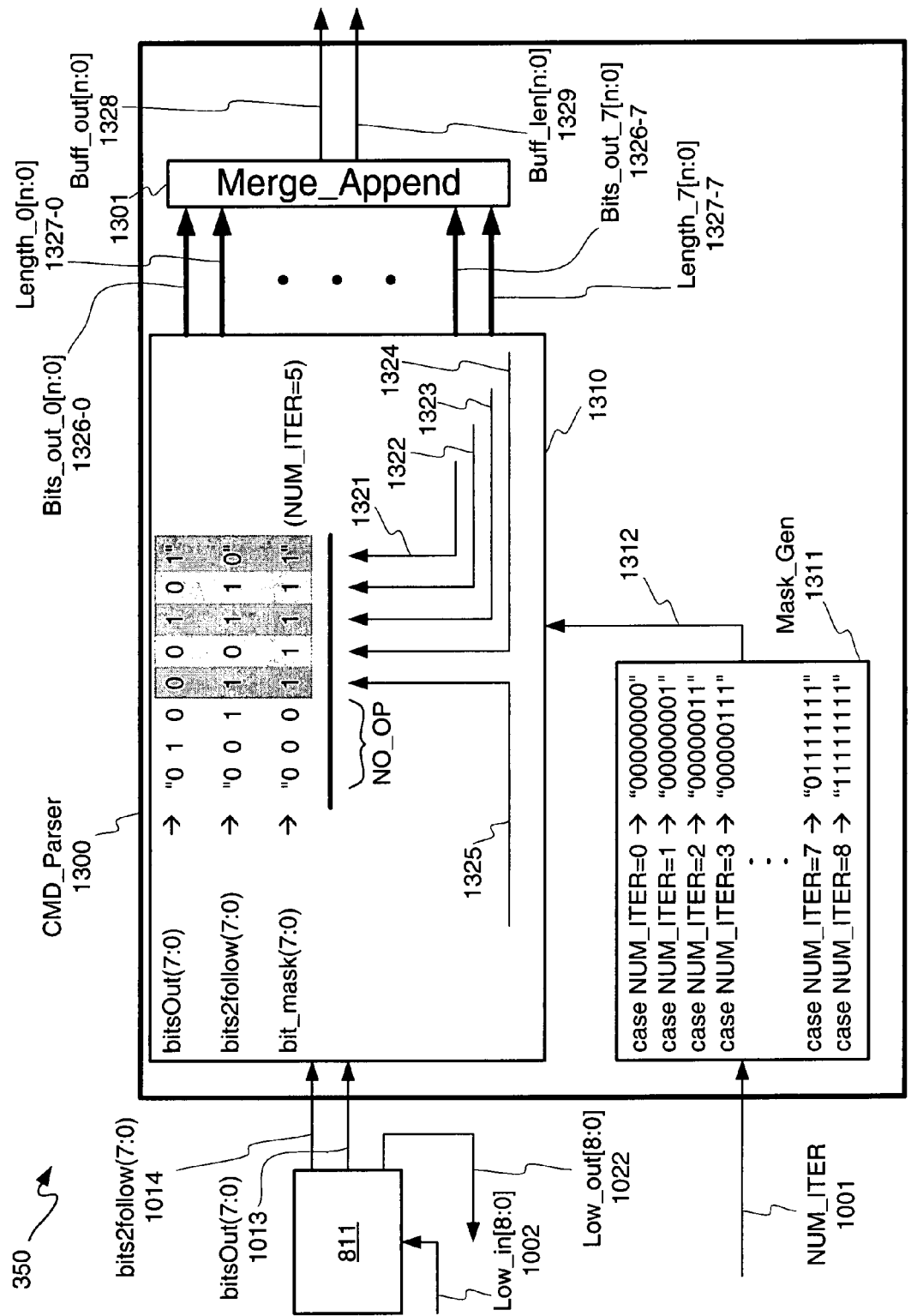
FIG. 13 is a block diagram depicting an exemplary embodiment of a command parser coupled to a merge and append buffer and a normalizer of the encoder module of FIG. 8.

FIG. 13 is a block diagram depicting an exemplary embodiment of command parser 1300 coupled to normalization block 811 both of binary arithmetic encoder module 350. Command parser 1300 includes mask generator 1311, merge and append block 1301, and parser 1310. Normalization block 811, which may include normalization circuit 1000 of FIG. 10 (not shown in FIG. 13) and NUM_ITER generation circuit 1100 of FIG. 11 (also not shown in FIG. 13), provides bits to follow signal 1014 and bits out signal 1013 as inputs to parser 1310 of command parser 1300. Parser 1310 includes an Ebits_to_follow counter (not shown in FIG. 13).

NUM_INTER signal 1001, which may come from normalization block 811 though not illustratively shown for purposes of clarity, is provided as an input to mask generator 1311 of command parser 1300. Mask generator 1311 may be implemented as a look-up table.

Responsive to NUM_ITER 1001, mask generator 1311 provides a bit mask signal 1312 to parser 1310. Bit locations of the bit mask equal to logic '0' are ignored when performing the operations of bit insertions and incrementing the Ebits_to_follow counter. Such operations are instructed from the values of bitsOut(7:0) and bits2follow(7:0). An example for NUM_ITER equal to five and for various values for signals 1013, 1014, and 1312 are illustratively shown for purposes of clarity by way of example and not limitation, to indicate operation of parser 1310. Thus, logic 0s of bit mask signal 1312 indicate no operation conditions. Logic 1s of bit mask signal 1312 indicate areas for either bit insertions or incrementing the Ebits_to_follow counter. Bits output signals 1014 and 1013 respectively indicate to increment the Ebits_to_follow counter and inserting bits into the output stream.

Continuing the example of NUM_ITER equal to 5, bit position 1321 is to indicate transmission of a logic 1 plus all outstanding bits and resetting of the outstanding bit counter (not shown). Bit position 1322 indicates incrementing the outstanding bit count and setting outstanding bits equal to one. Bit position 1323 indicates incrementing the outstanding bit count and setting outstanding bits equal to two. Bit position 1324 indicates transmitting of a logic 0 plus the two outstanding bits {1,1} and resetting an outstanding bit counter. Bit position 1325 indicates incrementing an outstanding bit count and setting outstanding bits equal to one.

Output from parser 1310 is for each of the bit positions, which in this example is from zero to seven. For each bit position, bits out signals 1326-0 through 1326-7 and length signals 1327-0 through 1327-7, respectively, are provided as inputs to merge and append block 1301. Output of merge and append block 1301 is buffered output 1328 and buffered length 1329.

It should be noted that two outstanding bits are added for slot 1323, whereas one outstanding bit is added for each of slots 1322 and 1325. Furthermore, it should be appreciated that an encoded stream is conventionally output in eight bit words. For example, where five bits are present in an encoded stream and three bits have been encoded to be added to the five bits, the five bits may be shifted over and the three bits added. If, however, only two bits had been encoded, the encoder may wait until the last bit is encoded for insertion to form an eight bit word.

In summary of this example, output of normalization block 811 is input to command parser 1300 to employ thereto an 8-bit mask with a NUM_ITER number of an LSB logic '1' bit. For example, if NUM_ITER equals 3, then the mask is given as "00000111". Parser 1310 has a function to determine the insertion of bits, add the outstanding bits, and reset the outstanding bit counter. An input to parser 1310 is the bit marked for insertion, namely bitsOuts[7:0] 1013. Other inputs to parser 1310 are the pointers to where the outstanding bit counter is to be incremented, namely bits2follow[7:0] 1014. Another input to parser 1310 is a bit mask 1312 which is derived from NUM_ITER 1001.

To further describe operation of command parser 1300, consider the following additional example. Suppose the following inputs of Table 1 are obtained from normalization block 811 and a bit mask 1312 is from NUM_ITER equal to 5:

TABLE 1

| Data | 76543210 |
| --- | --- |
| bitsOut[7:0] | 01000101 |
| bits2follow[7:0] | 00110110 |
| mask[7:0] | 00011111 |

In this example, there is a mask bit string of five ones, indicating which calculation LOW blocks of blocks 1020-1 through 1020-7 of FIG. 10 are to provide bits output 1013 ("bitsOut") and bits to follow output 1014 ("bits2follow"). In this example, the outputs of calculation LOW blocks 1020-1 through 1020-5 are to be used and the outputs of the other blocks are ignored. The logic 1 bits inside the 8-bit representation of bits2follow indicate for which of the calculation LOW blocks the outstanding bit counter is to be incremented. The order of the bits of bits2follow are such that bit 0 is the latched output of calculation LOW block 1020-1 and bit 6 is the latched output of calculation LOW block 1020-7 (the bit 7 location is not used). The bits in bitsOut are the bits inserted. This follows the same bit ordering as in bits2follow. Since the insertion of a bit and the incrementing of the outstanding bit counter do not occur simultaneously, bits 1, 2, 4, and 5 of bitsOut may all be ignored.

In the example, the five LSBs of bitsOut and bits2follow are used. Starting with the bit 0 location and assuming that the outstanding bit counter is currently zero, it may be observed that bits2follow(0)='1' and bitsOut='1', thus a logic '1' is inserted into the output encoding stream. In the bit 1 location, since bits2follow(1)='1', bitsOut is ignored and the outstanding bit counter is incremented by one. In the bit 2 location of the example, bits2follow(2)='1', the outstanding bit counter is thus equal to 2. In the bit 3 location, bits2follow(3)='1' and bitOut(3)='0', a logic '0' bit is transmitted into the stream followed by the two outstanding bits recorded by the outstanding bit counter. These two additional bits are the bit complement of the inserted logic '0' or "11".

The outstanding bit counter is reset to zero. This process of serving each of the segments included in the mask is pipelined into 8 stages, where stage 8 examines the bit 7 location. Thus, generally, the output of each stage is merged with the results of the next stage to produce the output signals 1328 and 1329, for example Buff_out[63:0] and Buff_len[63:0]. These two values represent the combined output of each of the stages and the number of bits that were merged, respectively.

Figure 14:
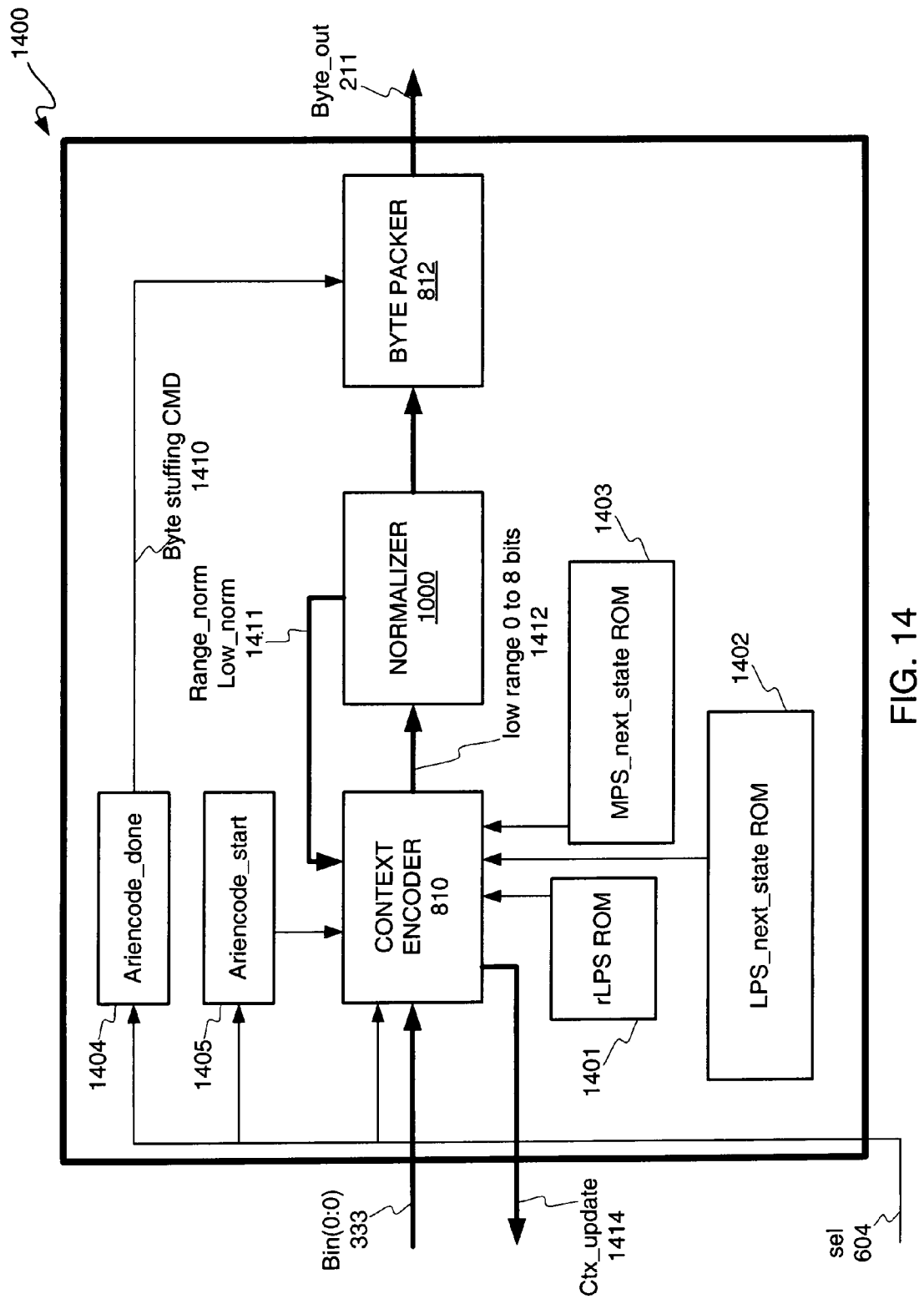
FIG. 14 is a block diagram depicting an exemplary embodiment of another encoder module.

FIG. 14 is a block diagram depicting an exemplary embodiment of an encoder module 1400. Encoder module 1400 may be binary arithmetic encoder module 350 of FIGS. 3 and 8. Thus, binary input 333 is provided to context encoder 810. Additionally provided to context encoder 810 is select signal 604, which is also provided to arithmetic encode done block 1404 and arithmetic encode start block 1405. Arithmetic encode start block 1405 initiates encoding by context encoder 810.

Context encoder 810 obtains LOW values from RANGE LPS memory 1401, high values from MPS next state memory 1403, and LOW values from LPS next state memory 1402. Context encoder responsive to obtained input provides LOW and RANGE values 1412 to normalizer 1000 of FIG. 10. Normalizer 1000 provides RANGE normalized and LOW normalized values 1411 back to context encoder 810. Additionally, normalizer 1000 provides output to byte packer 812. Byte packer 812 may include command parser 1300. Arithmetic encode done block 1404 provides byte stuffing command 1410 as an input to byte packer 812. Context encoder 810 provides context update 1414 to contexts memory 345 of FIG. 3. Byte packer 812 outputs encoded data 211 as a byte_out (7:0) form of output.

Figure 15:
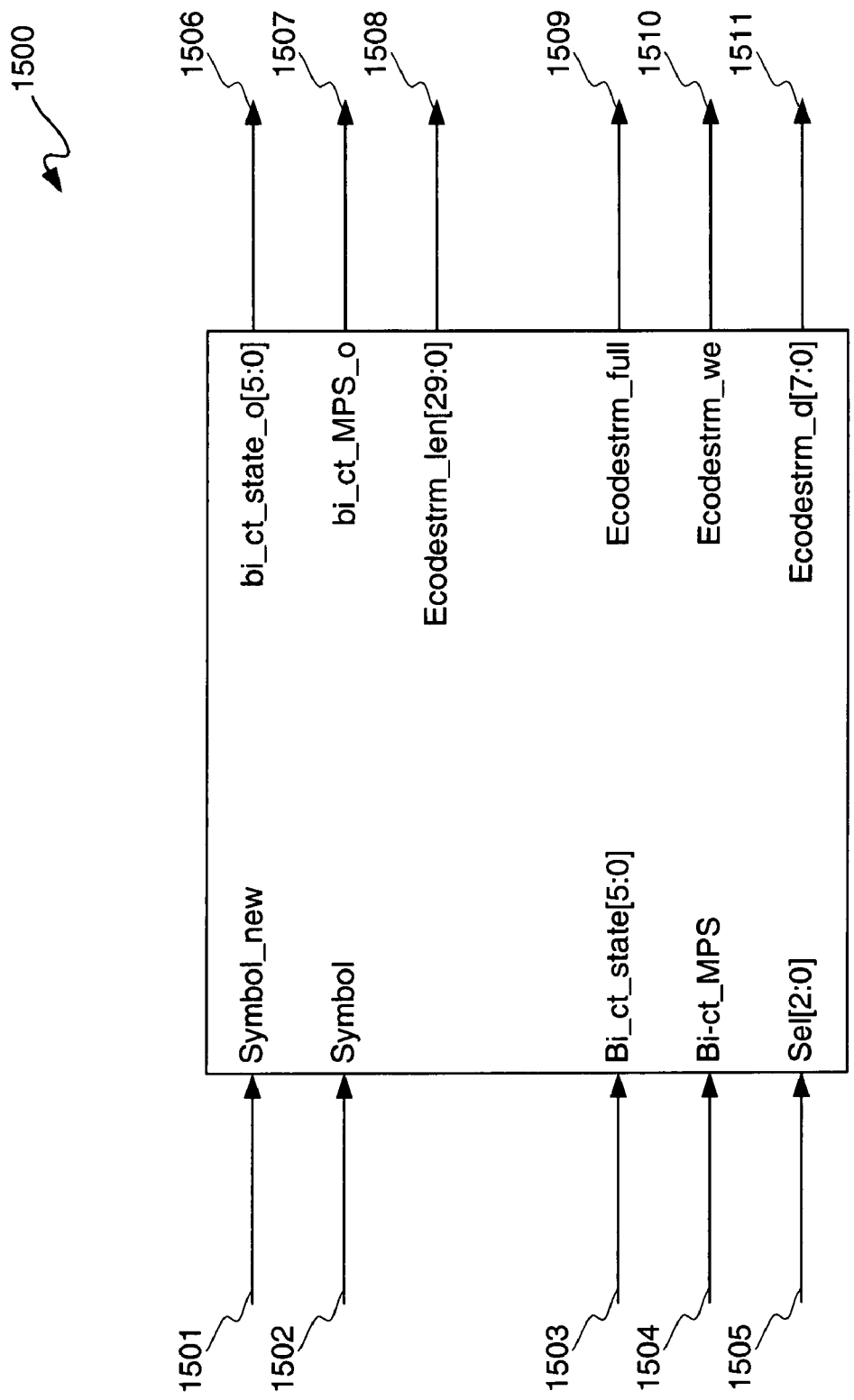
FIG. 15 is block diagram depicting an exemplary embodiment of a context encoder, which may be the context encoder in FIG. 14.

FIG. 15 is block diagram depicting an exemplary embodiment of a context encoder 1500, which may be context encoder 810 of FIGS. 8 and 14. Signals 1501 through 1505 are input to context encoder 1500, and signals 1506 through 1511 are output from context encoder 1500. Signal 1501 is a new symbol signal indicating a new binary input with context information is available. Signal 1502 is the binary input to encode, namely a symbol to be encoded.

Binary context state index indicates the symbol context probability and is provided as signal 1503. Binary context MPS indicates whether the symbol is an MPS symbol, namely a logic 1 for an MPS signal and a logic 0 if not an MPS signal, and is provided as signal 1504. Select signal 1505 may be select signal 604.

Binary context state output is an updated context and is provided as output signal 1506. Binary context MPS output is an updated MPS bit and is provided as output signal 1507. Encoded stream length indicates the number of bytes encoded and is provided as output signal 1508. Encoded stream full output signal 1509 is to indicate that an output FIFO external to encoder 1500 may be full responsive to writing an encoded stream. Encoded stream write enable signal 1510 is to activate such an external output FIFO for writing encoded stream thereto. Encoded stream data signal 1511 is encoded data for output to such an external output FIFO.

Figure 16A:
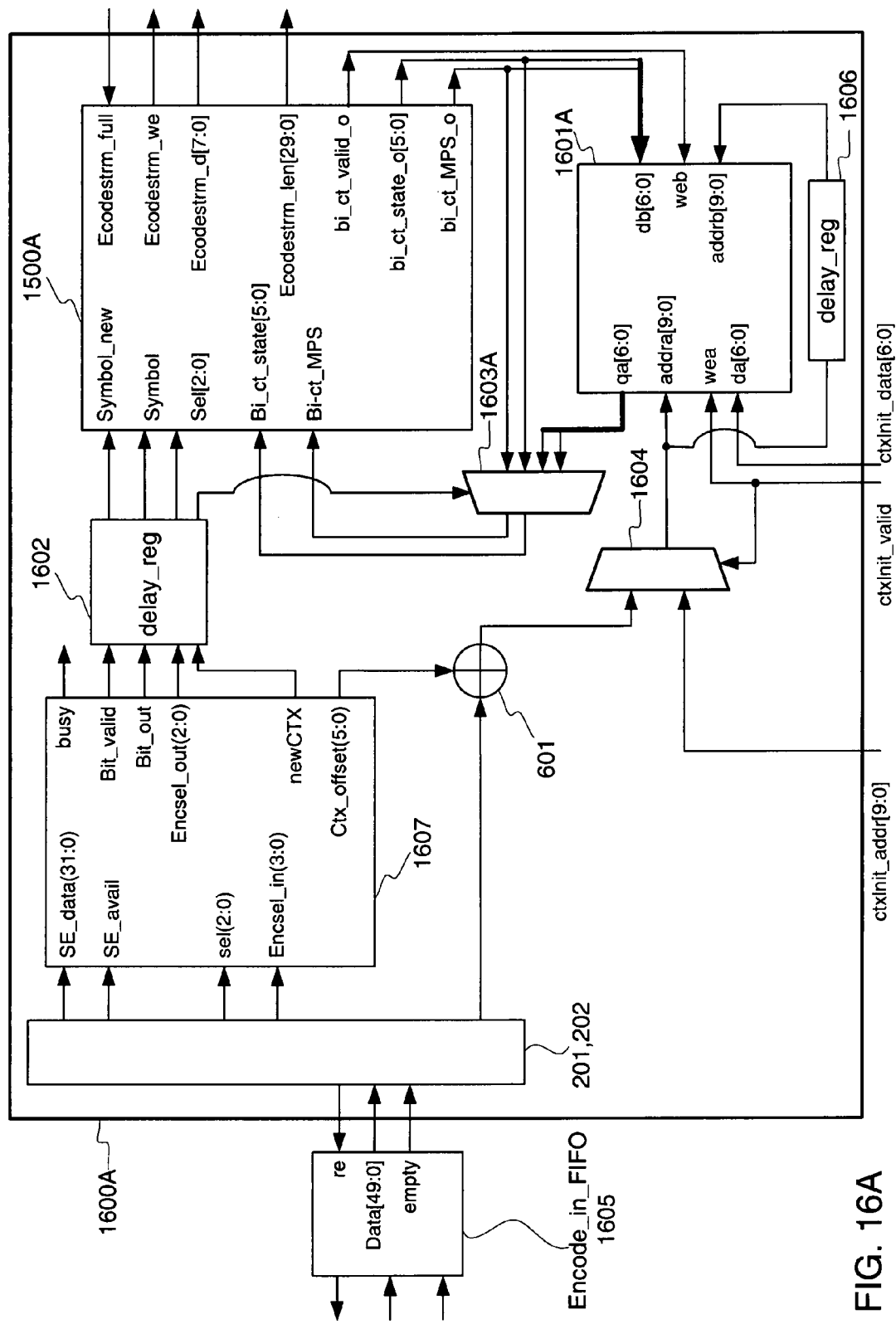
FIG. 16A is a block/circuit diagram depicting an exemplary embodiment of an encoding engine layout.

FIG. 16A is a block/circuit diagram depicting an exemplary embodiment of an encoding engine layout 1600A. Aspects of encoding engine layout 1600A have been previously described, and according same or similar terminology is used herein. Accordingly, some previously described content is not repeated for purposes of clarity.

Encoding engine layout 1600A is for context initialized or fixed encoding. Encoding engine layout 1600A may be coupled to an external encode input FIFO 1605. Encode input FIFO 1605 may be coupled to controller 201/preprocessor 202, which is coupled to a binarizer 1607. Binarizer 1607 is described elsewhere herein as binarizer 340 of FIGS. 3, 6, and 7.

Outputs of binarizer 1607 may be coupled to a delay register 1602 for providing input to binary encoder 1500A. Binary encoder 1500A is described elsewhere herein as binary encoder block 810. Outputs from binary encoder 1500A may be provided to multiplexer 1603A. Additionally, context address information output from adder 601 may be coupled to contexts memory 1601A via multiplexer 1604. Contexts memory 1601A may further have output from multiplexer 1604 delayed by delay register 1606 for input to contexts memory 1601A. Contexts memory 1601A may be implemented using a multi-ported RAM.

Figure 16B:
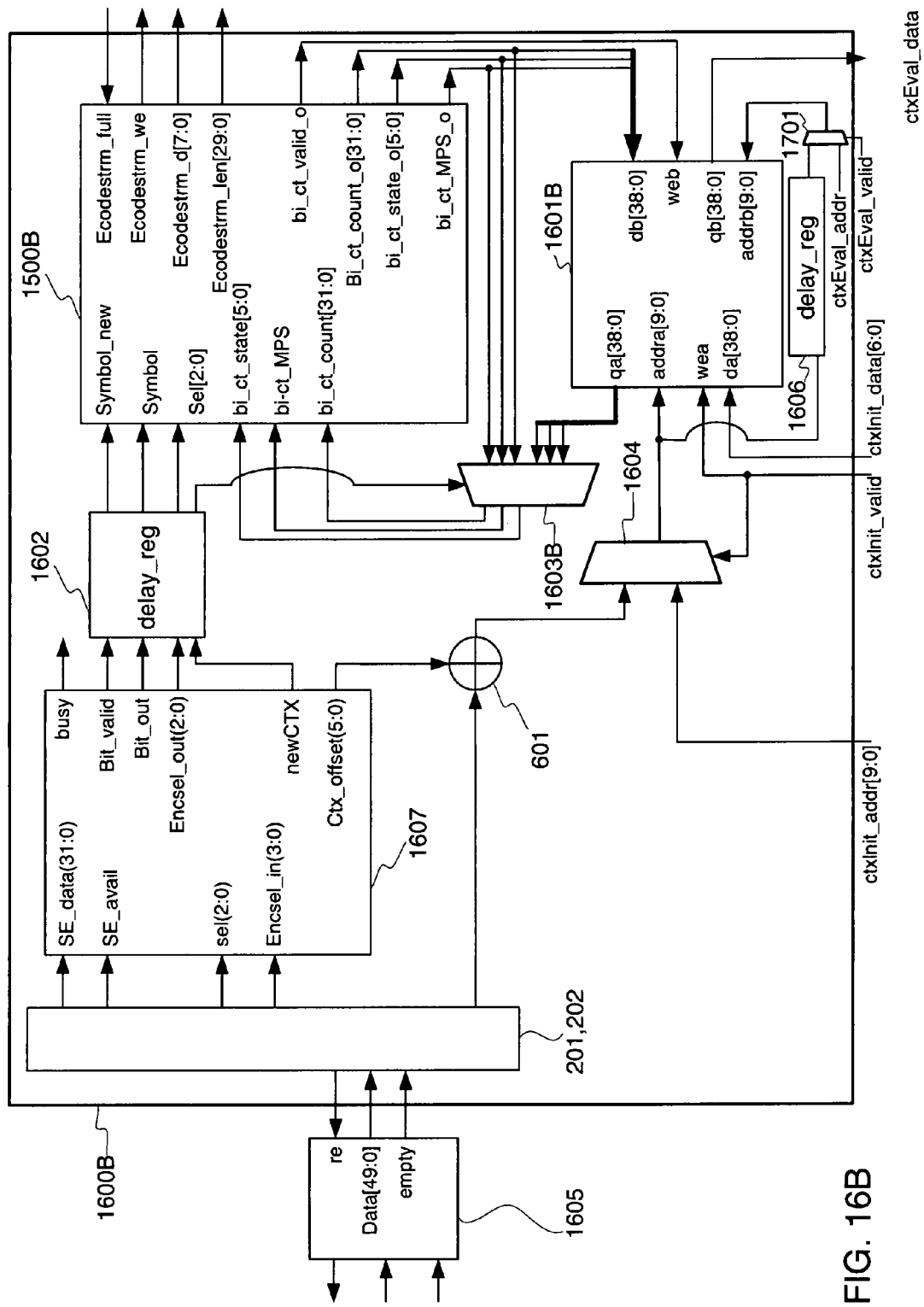
FIG. 16B is a block/circuit diagram depicting another exemplary embodiment of an encoding engine layout.

FIG. 16B is a block/circuit diagram depicting an exemplary embodiment of an encoding engine layout 1600B. Encoding engine layout 1600B is for context initialized encoding which is adaptive. Encoding engine layout 1600B is similar to encoding engine layout 1600A of FIG. 16A. Differences in encoding engine layouts 1600B from encoding engine layout 1600A include encoder 1500B, multiplexer 1603B, and contexts memory 1601B, as well as the addition of multiplexer 1701.

With reference FIGS. 16A and 16B, there are 17 types of contexts. Contexts may be grouped by type of SE to encode. One of the 17 types of contexts is macroblock type information encoding. Another type is an eight-by-eight block type information encoding. Another type is a motion vector data for B-frames encoding. Another type is a macroblock reference parameter encoding. Another type is a CBP of for a delta QP encoding. Another type is macroblock adaptive field frame encoding. Another type is a macroblock intraprediction size information encoding. Another type is a macroblock intraprediction mode encoding. Another type is a chroma intra-prediction mode of an eight pixel-by-eight pixel macroblock encoding. Another type is a coded block pattern of an eight pixel-by-eight pixel macroblock encoding. Another is a motion vector CBP encoding. Another type is a significant map integer transform coefficients encoding. Another type is a least significant map coefficient encoding. Another type is a significant logic 1 value level coefficient encoding. Another type is a significant level coefficient encoding. Another type is a significant field mapping ("run-length") encoding. A last type is a last significant field mapping encoding.

For instantiation in W slices of an FPGA, for W an integer substantially greater than one, there is only one separate set defined for each of the 17 SE types. For other slice types, three models are defined for each of the 17 SE types. All 17 SE types may be combined for 2,816 pairs of initial raw values that are later used to initialize the contexts memory. To initialize contexts memory 345, a context model is selected and the initial probability states of the contexts memory 345 based on the context model number values and the current QP are computed. With respect to selecting a context model, for fixed initialization only one model is selected for encoding each slice. In adaptive initialization, the model used for encoding the next slice is computed based on a weighted statistical usage of the current model used for encoding by comparing the two models.

FIG. 17A is a program listing depicting an exemplary embodiment of macro for AFF initialization context values 1700A. This is merely an example for purposes of clarity and not limitation, and other numerical values may be used.

FIG. 17B is a program listing depicting an exemplary embodiment of a context initialization routine 1700B. Context initialization routine 1700B initializes a given context with some predefined probability state information. Again, though particular numerical examples are illustratively shown for purposes of clarity, it should be appreciated that other numerical values may be used.

Figure 18A:
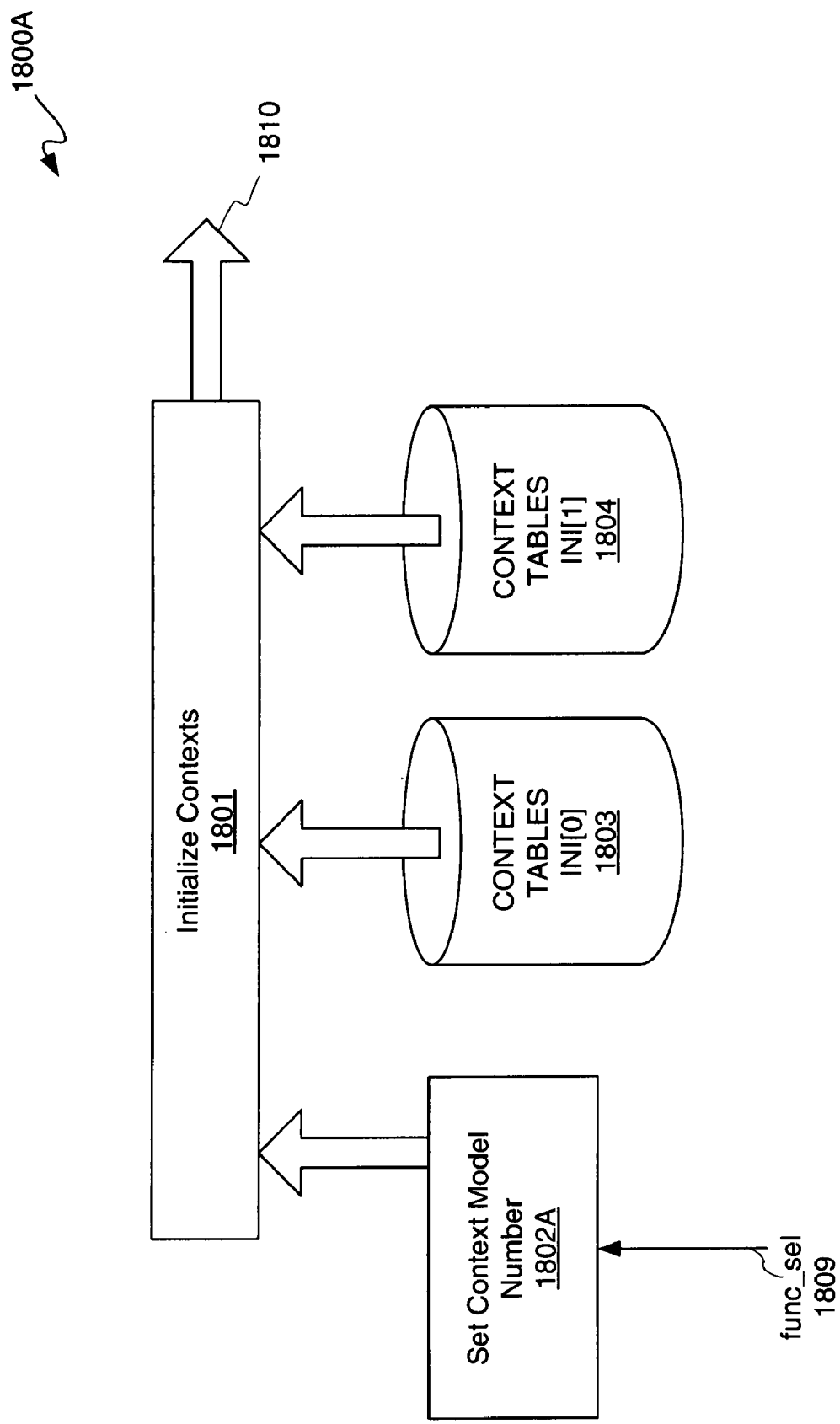
FIG. 18A is a data flow diagram depicting an exemplary embodiment of a data flow for fixed initialization context management.

FIG. 18A is a data flow diagram depicting an exemplary embodiment of data flow 1800A for fixed initialization context management. A function select signal 1809 is provided to a set context model number CABAC block 1802A. This model number may be zero, one, or two and it is called at the start of every new slice. The set context model number is provided from block 1802A to initialize contexts block 1801 for CABAC. Context tables 1803 and 1804 provide context input to initialize contexts block 1801. Context tables 1803 and 1804 respectively represent initialization zero and initialization one contexts.

Contexts initialize block 1801 is called at the start of every new slice to provide model number, QP, and frame type. Examples of frame types are I frames or P frames. Output of context initialize block 1801 is provided as context data 1810 to contexts memory 345.

Figure 18B:
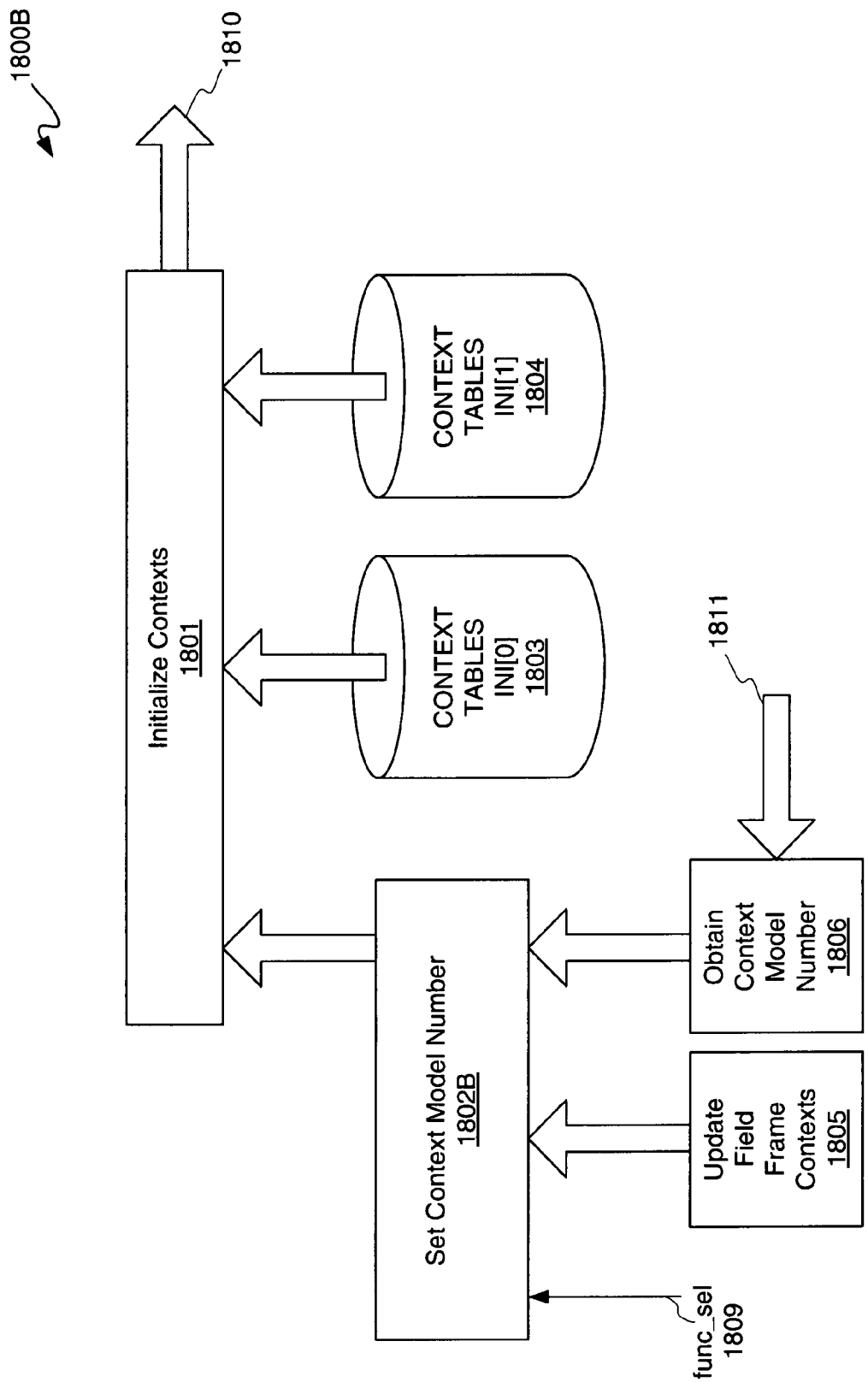
FIG. 18B is a data flow diagram depicting an exemplary embodiment of a data flow for adaptive initialization context management.

FIG. 18B is a data flow diagram depicting an exemplary embodiment of data flow 1800B for adaptive initialization context management. Function select signal 1809 is provided to set context model number CABAC 1802B. Additionally provided to select context model number CABAC 1802B are outputs respectively from blocks 1805 and 1806. Block 1805 is an update field frame contexts for picture interlace mode, which is called at the start of every frame when the configuration file picture interlace is set to adaptive for field/frame coding. Obtain context model number CABAC block 1806 is for a weighted sum of context and contexts memory.

Block 1806 determines a next model number to use and is called at the end of every slice. Outputs from blocks 1805 and 1806 as well as function select 1809 are used by set context model number CABAC block 1802B to set frame type, model number, namely zero, one, or two, and field picture flag. Outputs from blocks 1805 and 1806 are called at the start of every new slice.

Output from block 1802B is provided as an input to initialize context CABAC block 1801 as previously described. Furthermore, as previously described, block 1801 receives context information from context tables 1803 and 1804 which is called at the start of every new slice. Context output 1810 is provided to contexts memory 345. Obtained from contexts memory 345 is context input 1811 which is provided to block 1806 to provide the weighted sum of such contexts.

For run-level encoding, bit integer transforms are encoded in four steps, namely run computation, determination and encoding of a CBP bit, encoding of a significance map or run, and encoding of significant coefficients or level. As run-level encoding is well known, it is not described in unnecessary detail herein other than to state that such encoding involves the following steps: access a block in zigzag scan order, produce significance map marking coefficients as either significant or not, marking a last significant coefficient as such, storing sign bit and determining absolute value of each of the coefficients, sending to an encoding engine the significance map and coefficients up to the last significant coefficient to be binarized and then encoded, and only encoding significant coefficients.

Accordingly, it should be appreciated that a CABAC encoder may be implemented in programmable logic of an FPGA as a core. Some FPGAs, such as the Virtex family of FPGAs, can be programmed to incorporate blocks with pre-designed functionalities, i.e., "cores". A core can include a predetermined set of configuration bits that program the FPGA to perform one or more functions. Alternatively, a core can include source code or schematics that describe the logic and connectivity of a design. Some cores include an optimally floor planned layout targeted to a specific family of FPGAs. Cores can also be parameterizable, i.e., allowing the user to enter parameters to activate or change certain core functionality.

It should be appreciated that the CABAC encoder core accepts symbols to encode and generates compressed bitstreams. Such compressed bitstreams may be as specified by ITU-T VCEG together with the ISO/IEC MPEG as the product of a partnership effort known as the JVT. The collaborative effort is also known as H.264/AVC/MPEG 4 Part 10. The functionality of the CABAC encoder core for video compression as described herein achieves a high degree of adaptation and redundancy reduction by combining an adaptive binary arithmetic coding with context modeling.

A binarizer is used to uniquely map the value of an SE into a binary sequence where each bit of such a sequence is called a bin or binary input. Then for each bin of the binarized SE, a probability model is selected from contexts memory. Both the bin value and its associated context model are passed to a binary encoder. The two outputs of the binary encoder are the LOW and RANGE values obtained from the arithmetic encoders iterative division of the probability interval. Whenever RANGE is not capable of being represented within a fixed bit width or length, such as with nine bits in accordance with the above-identified standard, both RANGE and LOW are brought back into RANGE by a normalizer which performs a rescaling function through shift operations.

The bits shifted out of LOW constitute the actual results of the compression process. The shifted bits may then packed into bytes. As described herein there is support for multiple slices per frame. Additionally, both High-Definition ("HD") 1080 interlaced and progressive resolutions presently available are supported where frames per second may be 25, 30, 50, 60, up to operation at 75 megabits per second. Furthermore, a CABAC encoder core described herein may support high profile encoding with 4:2:0 chroma format. QP may change on a frame and macroblock basis. Moreover, fixed models zero, one, and two are supported. Additionally, bits per slice and bits per macroblock output options are provided for adaptive rate control.

A CABAC encoder core as described herein may be utilized in supporting H.264 compliant applications, such as for example where hardware acceleration is used to achieve real-time operation. Typical applications may be video surveillance, video conferencing, and video broadcasting. Additionally, a CABAC encoder core as described herein may be used as a standalone application where lossless arithmetic coding is desired. As described herein, different types of SEs are first preprocessed to determine their current context and then are encoded by an encoding engine. Slice and macroblock level control allows for a CABAC encoder core to process data when such data is available at its input. Accordingly, it should be appreciated that the CABAC encoder core described herein provides a real-time encoding solution for instantiation in an FPGA in compliance with H.264 video entropy encoding.

Figure 21:
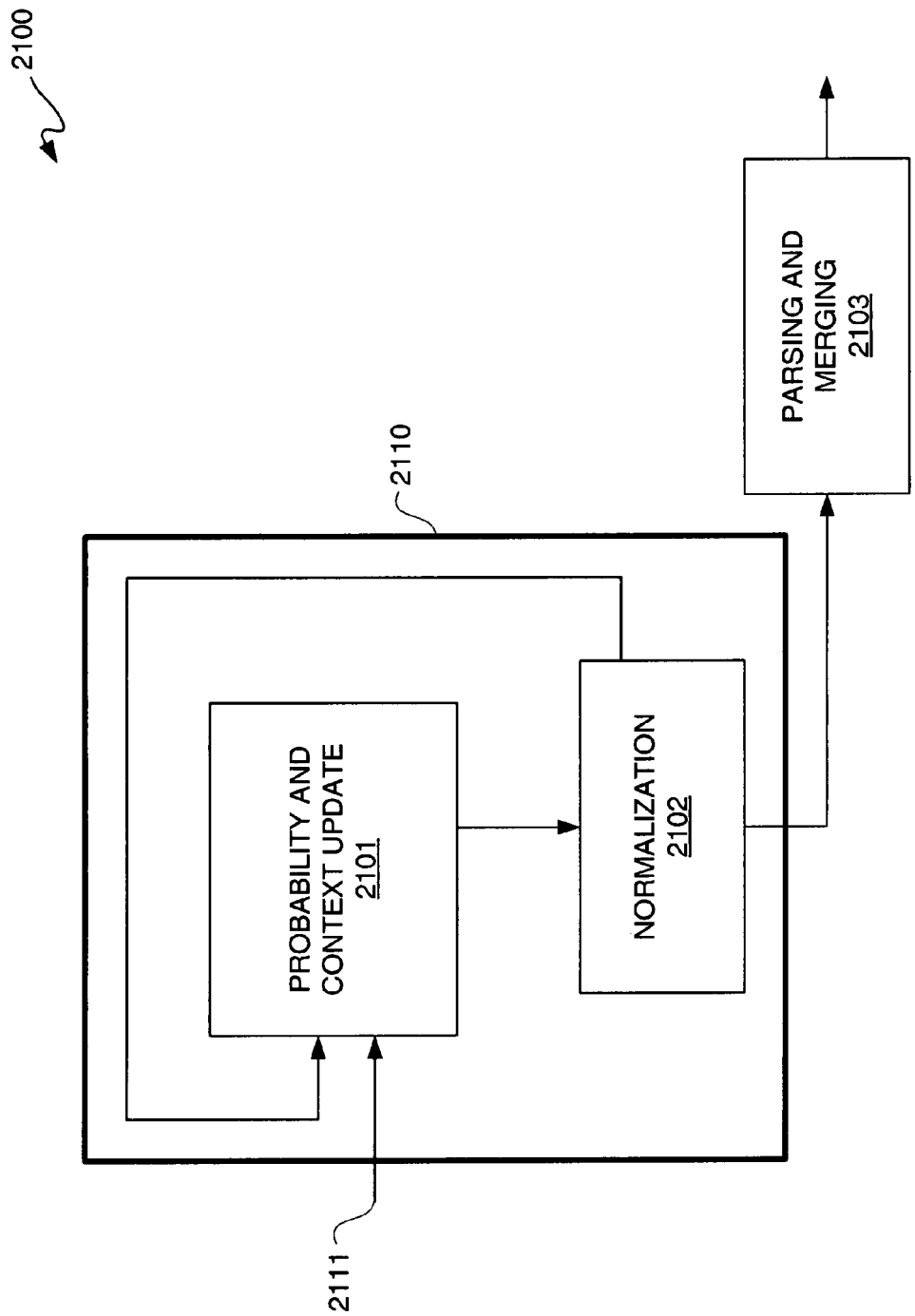
FIG. 21 is a block/flow diagram depicting an exemplary embodiment of an encoding flow.

FIG. 21 is a block/flow diagram depicting an exemplary embodiment of an encoding flow 2100. Input 2111 to probability and context update 2101 includes a symbol to encode. Probability and context update 2101 and normalization 2102 are part of a feedback loop 2110 that is completed in a period of a single clock cycle. Updates of probabilities and context, as well as normalization, is thus completed before the arrival of the next symbol to encode at the next clock cycle.

Output of probability and context update 2101 is provided to normalization 2102, and output of normalization 2102 is provided as a feedback input to probability and context update 2101. Additionally, output of normalization 2102 is provided to parsing and merging block 2103 and output of parsing and merging block 2103 is an encoded symbol, namely an encoded output bitstream.

Figure 22:
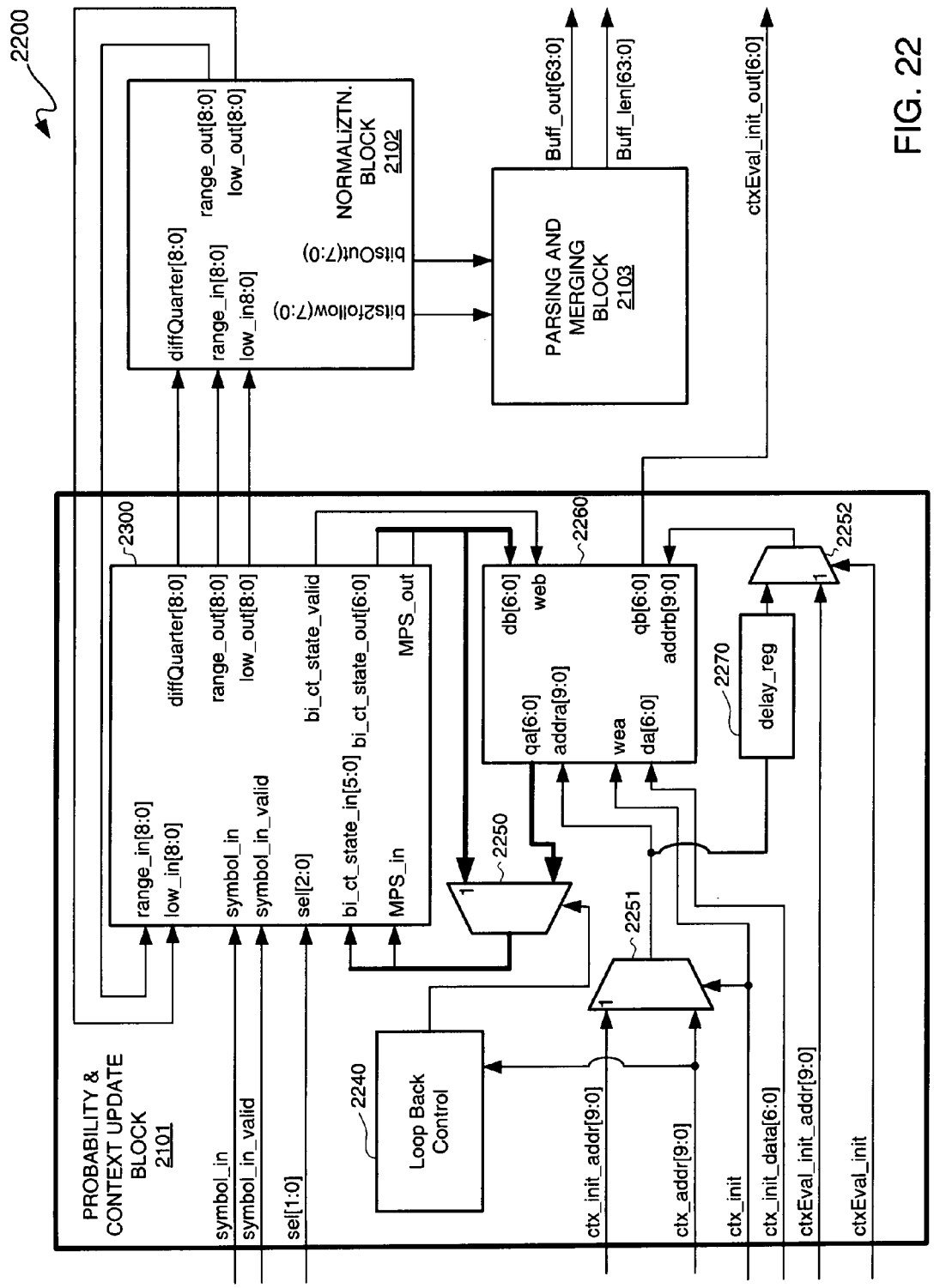
FIG. 22 is a block/circuit diagram depicting an exemplary embodiment of an encoder module for encoding flow of FIG. 21 with interfacing details.

An example implementation of blocks 2101 through 2103 is described in additional detail with reference to FIG. 22. FIG. 22 is a block/circuit diagram depicting an exemplary embodiment of an encoder module 2200, namely an implementation of encoding flow 2100 of FIG. 21 with interfacing details. Accordingly, illustratively shown in FIG. 22 are probability and context update block 2101, normalization block 2102, and parsing and merging block 2103.

The input signals to encoder module 2200 are defined as: symbol_in—binary symbol to encode; symbol_in_valid—indicates that a symbol_in is new; sel[1:0]—based on its value, instructs the block as to the probability type of the symbol to encode; ctx_addr[9:0]—the index to the context table; ctx_init_addr[9:0]—an address bus used to initialize memory 2260 (such as dual ported random access memory); ctx_init—informs the block to reinitialize the context table; ctx_init_data[6:0]—a data bus used to initialize memory 2260; ctxEval_init_addr[9:0]—an address bus to access post encoding contents of probabilities for adaptive context initialization; and ctxEval_init—to select the ctxEval bus during adaptive context initialization.

With respect to symbol_in_valid, this signal is used for latching. With respect to sel[1:0], the defined types are: "00"—arithmetic encoding of the binary symbol by using the probability value of its context information; "01"—arithmetic encoding of the binary symbol by assuming that elements of the context are equiprobable; and "10"—arithmetic encoding of the last symbol before encoding process termination. With respect to ctx_init: initialization is performed at the beginning of a frame (or slice) to encode.

The output signals to encoder module 2200 are defined as: Buff_out[63:0]—an output of the append and merging block; Buff_len[5:0]—another output of the append and merging block; ctxEval_init_out[6:0]—a port allowing access to all the context probabilities after encoding, which port may be used to collect the updated probabilities for adaptive context initialization. Buff_out[63:0] is the output bitstream prior to packaging into bytes. Buff_-len[5:0] provides the actual length of the bits contained in Buff_out[63:0] that are to be packaged by a byte packer, and its value represent the LSBs. With respect to ctxEval_init_out[6:0], this port may be used to collect the updated probabilities for adaptive context initialization.

Probability and context update block 2101 has the following functions: to compute intermediate values of LOW and RANGE prior to normalization, which is done in probability update block 2300, which is described below in additional detail; to compute the new probability of the current symbol in a single clock cycle, which is done in probability update block 2300; to store the updated probability of the symbol within its current context in a single clock cycle, which is done in context update block; to switch between contexts in a single clock cycle, which is done in the context update block or memory 2260; and to initialize the context information located in the table of contexts, which is done in context update block 2260.

Figure 23:
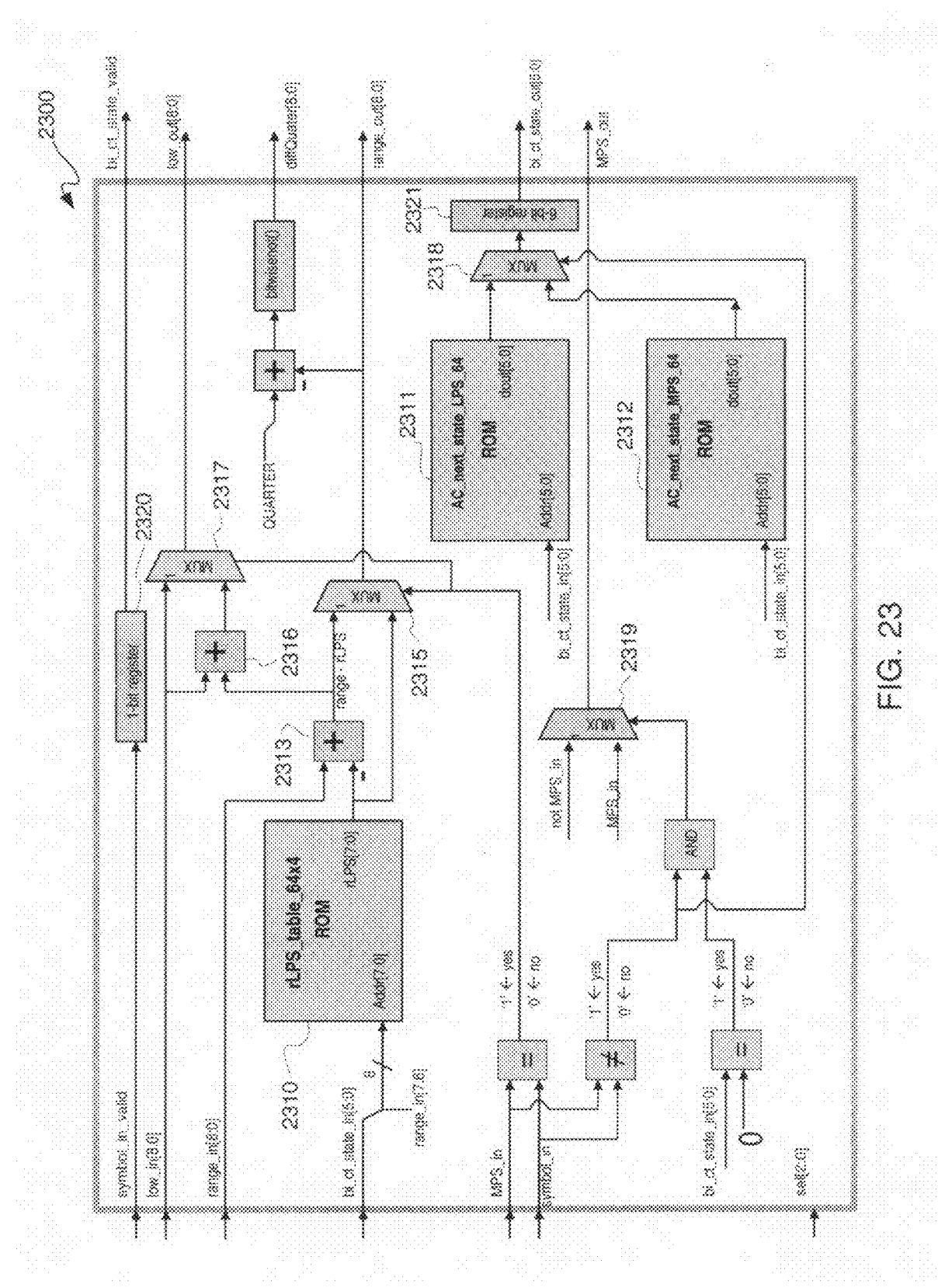
FIG. 23 is a block/circuit diagram depicting an exemplary embodiment of a probability update block of a probability and context update block, which is part of the encoder module of FIG. 22.

FIG. 23 is a block/circuit diagram depicting an exemplary embodiment of probability update block 2300. Probability update block 2300 may be of probability and context update block 2101 of FIG. 22. The functions and names of input signals to probability update block 2300 are: symbol_in_valid—indicates that a new symbol to encode is valid at the input port; low_in[8:0]—current low value of probability interval; range_in[8:0]—current range value of probability interval; MPS_in—current symbol is MPS; bi_ct_state_in[5:0]—index of probability value of current symbol; and sel[2:0]. Based on its value, sel[2:0] instructs the block of the probability type of the symbol to encode, where the defined types are: "00" for arithmetic encoding of the binary symbol by using the probability value of its context information; "01" for arithmetic encoding of the binary symbol by assuming that elements of the context are equiprobable; and "10" for arithmetic encoding of the last symbol before encoding process termination. Of all the values of the sel[2:0] signal, only the instance of when it is "00" is described for purposes of clarity, as all the other instances are less complicated and follow from the description herein.

To the right of probability update block 2300 are the output signals whose names and purpose are: bi_ct_state_valid—output signal to indicate that a probability update was produced by the block; bi_ct_state_out[5:0]—updated index of probability value of current symbol; low_out[8:0]—intermediate low value prior to normalization; range_out[8:0]—intermediate range value prior to normalization; diffQuarter[8:0]—distance of range from QUARTER; and MPS_out—update to MPS status of current symbol.

Probability update block 2300 computes the intermediate values of LOW and RANGE. These intermediate values are then normalized, as previously described, externally from probability update block 2300. Concurrently, the MPS status of a symbol may be updated, as well as the probability of occurrence of the symbol within the given context. Probability update block 2300 performs the operations illustratively shown in FIG. 19 at 1905, 1906, 1907, 1918, and 1919 of the "biari_encode_symbol" function. In FIG. 19, as illustratively shown at 1905, the rLPS table 64×6 array is used to update RANGE$_{LPS}$. In FIG. 23, an FPGA LUT may be used to provide a read-only memory function ("ROM") 2310 with the probability state index ("bi_ct_state_in[5:0]") and range ("range_in[8:0]") concatenated to form the read address. Inputs to multiplexer 2315 are from rLPS_table__64×4 ROM 2310 and the concatenated read address output from adder 2313. Multiplexer 2315 selects the value of its output, namely range_out[8:0], to be (range–rLPS) only if the symbol to encode is MPS. Otherwise the output from the rLPS_table__ 64×4 ROM is selected.

The intermediate value of LOW, as may be associated with 1903 and 1907 of FIG. 19, are implemented in probability update block as follows. The new value of LOW is the output of adder 2316, which may be associated with 1907 of FIG. 19. LOW is updated through multiplexer 2317 only when the symbol to encode is not an MPS.

While performing the intermediate updates of LOW and RANGE, the context probability index bi_ct_state_in[5:0] is updated using the AC_next_state_LPS__64 ROM 2311 if the symbol to encode is not an MPS; otherwise, it is updated using the AC_next_state_MPS__64 ROM 2312. The selection is driven by the MPS status of the symbol to encode and the selection is via multiplexer 2318.

Concurrently with the updates of LOW, RANGE and probability index, the MPS status of the current symbol is updated. The update circuitry is through multiplexer 2319 whose selection input is driven by the logic that determines if the current symbol is not an MPS and that its associated probability is zero. If true, then the MPS update, MPS_out, is the bit inverse of MPS_in.

Another update performed by probability update block 2300 is computing the bitwise complement of the distance of the updated value of range from QUARTER by the following equation:

$$\mathit{diffQuarter} = \overline{\mathrm{QUARTER} - \mathrm{range\_out}}$$

With the exception of a 1-bit register 2320 and a 6-bit register 2321 that exist in flip-flops of an FPGA, such as an FPGA from Xilinx, Inc., the rest of the logic may be implemented inside LUTs of an FPGA.

With respect to a context update block 2260, which is implemented in memory, a context model is a probability model for bin values of a binarized symbol. In CABAC, the context model involves the selection of the available model for a given symbol based on a syntax element. For example, a syntax element may be one of the 17 types of contexts probability models defined in the H.264 standard, as described with reference to FIGS. 16A and 16B above. This selection of the available model for a given symbol depends on the statistics of the recently encoded data. A symbol is encoded according to the selected context probability model. The context model is then updated according to the coded value.

Before the encoding of a frame or slice, for example, context probabilities are initialized. With renewed reference to FIG. 22, a dual-port RAM, such as a BlockRAM of an FPGA from Xilinx, Inc., serves as context table, namely context update block or table 2260, and is used to store the probability updates and is initialized externally from the encoder module through associated data and address buses ctx_init_data[6:0] and ctx_init_addr[9:0], respectively. Context table 2260 is accessed during initialization through multiplexer 2251 of FIG. 22 that selects ctx_init_addr[9:0] whenever ctx_init is logic high. The signal ctx_init also writes the data of data ctx_init_data[6:0] into the select address of context table 2260. After the initialization process completes, encoding of the first symbol may begin.

During encoding, the probability update of a symbol is executed in a single clock cycle. If the next symbol to encode belongs to the same syntax element as the previous symbol, then the probability updates of the previous symbol are used. Otherwise, the new symbol is encoded with the contexts of its syntax element. This may be achieved by accessing the context information stored in context table 2260 using the address bus ctx_addr[9:0] of FIG. 22. Multiplexer 2250 in FIG. 22 loops back the updated bi_ct_state_out[5:0] and MPS_out signals into a probability update block, as the previous address value of ctx_addr[9:0] is the same as the current one. If ctx_addr[9:0] does not change, this is an indication that the new symbol is in the same probability context.

Multiplexer 2250 is controlled by a "Loop Back Control" block 2240 that outputs a logic "1" whenever there is not change in ctx_addr. In the event that there is a change in ctx_addr between symbols, the associated update is stored in context table 2260. A delay register 2270 stalls the value of ctx_addr at port b of context table 2260 so that the correct context address is available when probability update block 2300 is ready to store the new update.

CABAC has two modes of context table initialization: fixed initialization and adaptive initialization. In both modes, context table 2260 may be initialized through the data and address busses, namely ctx_init_data[6:0] and ctx_init_addr [9:0], respectively. The initialization process may be performed prior to any encoding.

In adaptive initialization, the contents of context table 2260 are evaluated, after the encoding of a frame or slice for example, in order to determine how to initialize context table 2260 for the next frame or slice. To extract the contents of context table 2260, the address bus ctxEval_init_addr[9:0] is used. It has access to context table 2260 through multiplexer 2252 controlled by the input signal ctxEval_init. The output of context table 2260 is provided as the signal ctxEval_init_out[6:0].

Figure 24:
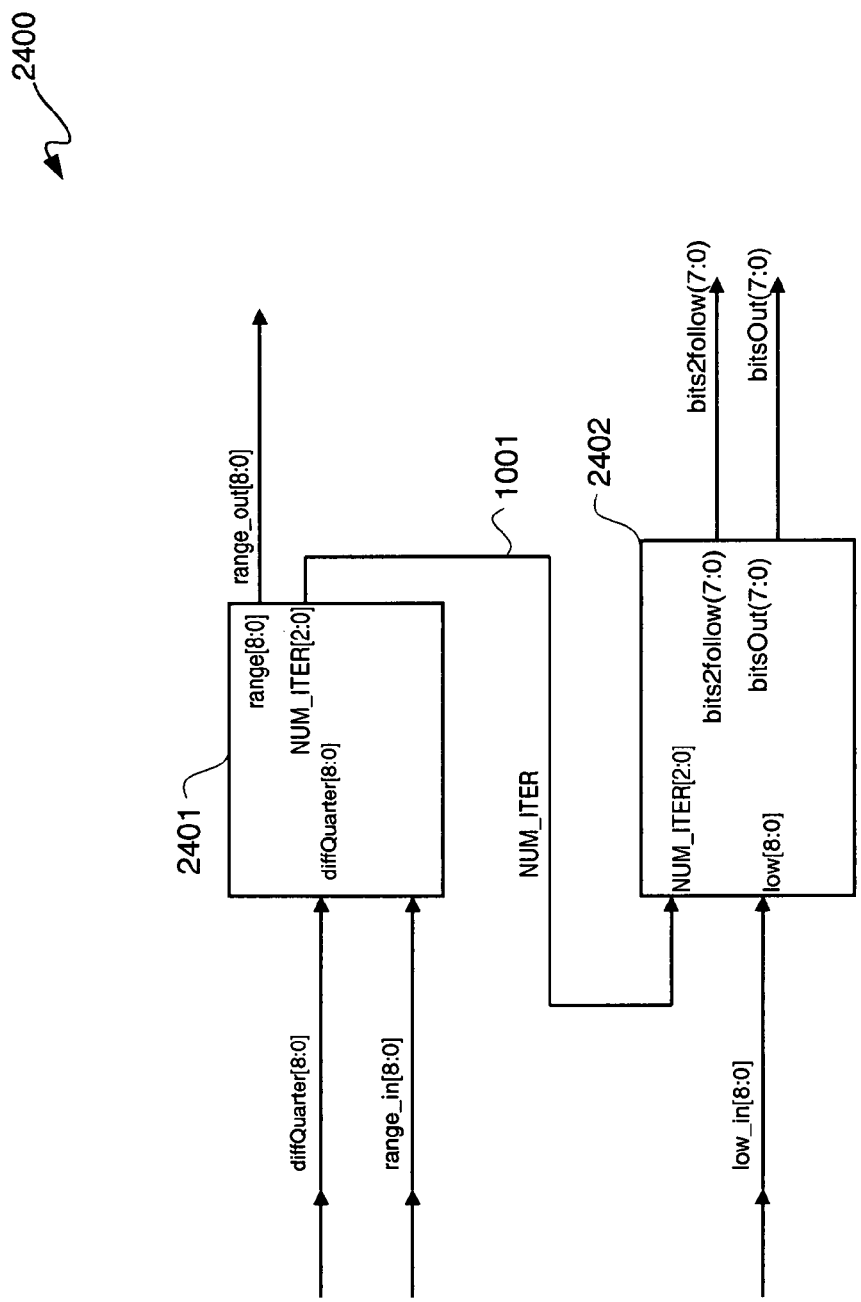
FIG. 24 is a block diagram depicting an exemplary embodiment of a normalization block, which is part of the encoder module of FIG. 22.

FIG. 24 is a block diagram depicting an exemplary embodiment of a normalization block 2400. Normalization block 2400 may be of normalization block 2102 of FIG. 22. Again, normalization is used if LOW is not between QUARTER and RANGE. In normalization block 2400, both LOW and RANGE values are normalized in sub-blocks 2401 and 2402, respectively, as described below in additional detail. Additionally, in sub-block 2401 a NUM_ITER signal 1001 is generated and provided to sub-block 2402.

As previously described, insertion of outstanding bits is not performed inside a normalization loop 2110. In FIG. 22, this insertion is performed in parsing and merging block 2103. Again, as the number of loop iterations for normalization is predetermined prior to entering the loop, parallelism is used as previously described. The number of loop iterations or NUM_ITER used for normalization is determined prior to normalization. Thus, the conventional normalization loop is unrolled to flatten out normalization into seven parallel processes. Each of the processes, namely calculation LOW blocks described above, represents an iteration stage of normalization. If it is determined that outstanding bits are to be inserted in any of the loop stages, then a 7-bit register (one bit for each stage) is used to make a note of this. The outstanding bits are then inserted in parsing and merging block 2103 of FIG. 22.

With renewed reference to FIG. 22, diffQuarter may be computed using fast carry adders/subtractors of, for example, an FPGA, such as an FPGA from Xilinx, Inc. This variable is the bitwise complement of the distance of the update value of RANGE from QUARTER. The bitwise inversion exposes the number of left bit shifts to be used so that RANGE becomes greater or equal to QUARTER. A LUT may be used to perform the bit shifts of RANGE, namely range normalization sub-block 2401. LUT 2401 outputs the number of iterations, namely NUM_ITER, to LOW normalization sub-block 2402 for normalization of LOW. Pseudo-code 1150 of FIG. 11 shows the process of simultaneously normalizing RANGE and determining the number of iterations, namely NUM_ITER.

Figure 25:
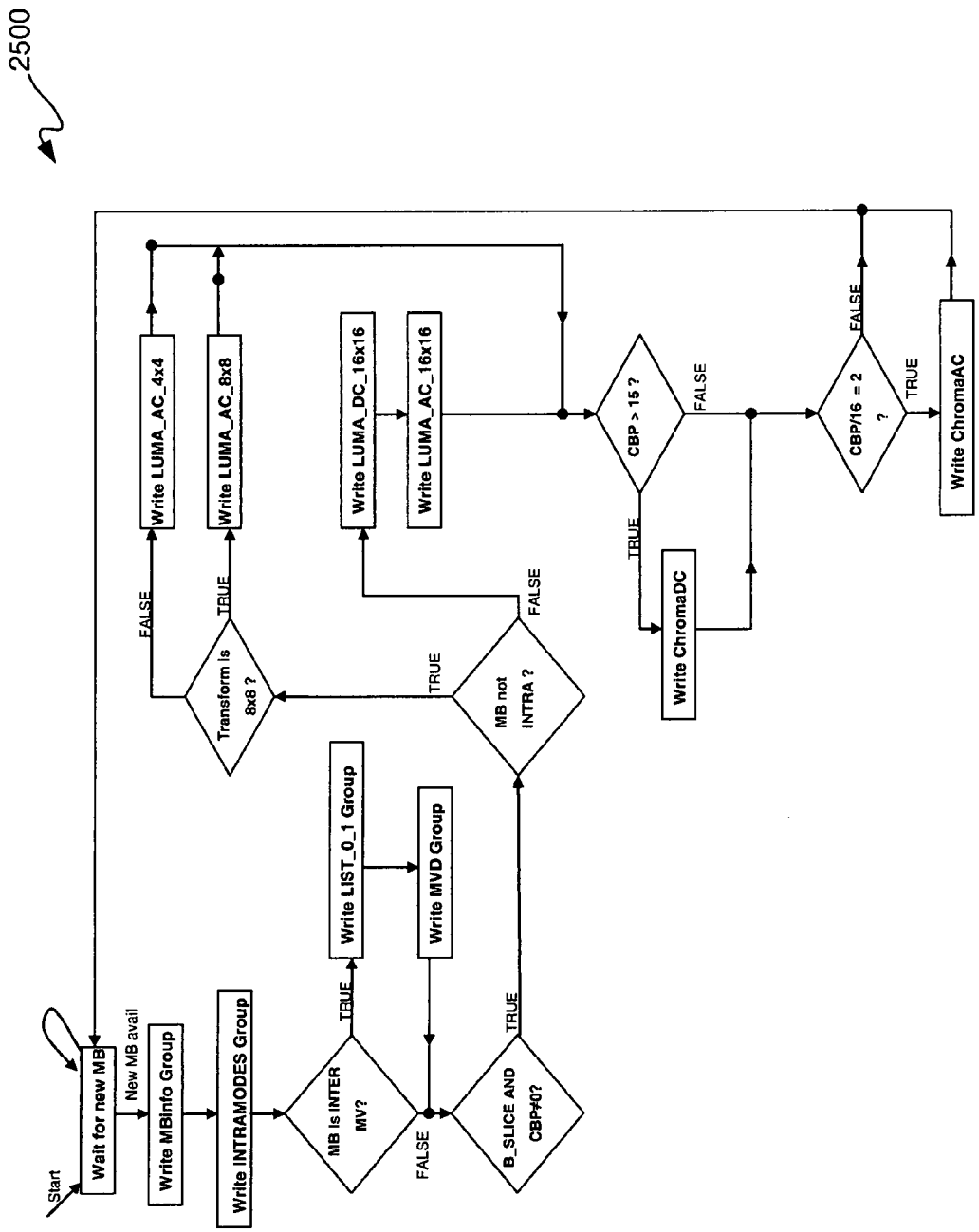
FIG. 25 is a state transition diagram depicting an exemplary embodiment of a macroblock parameters flow for writing macroblock parameters to a CABAC encoding core.

FIG. 25 is a state transition diagram depicting an exemplary embodiment of a macroblock encoding flow 2500 for writing macroblock parameters to a CABAC encoding core as described herein. Thus, macroblock parameters may be written to a CABAC encoding core as described herein in accordance with flow 2500.

While the foregoing describes exemplary embodiment(s) in accordance with one or more aspects of the invention, other and further embodiment(s) in accordance with the one or more aspects of the invention may be devised without departing from the scope thereof, which is determined by the claim(s) that follow and equivalents thereof. Claim(s) listing steps do not imply any order of the steps. Trademarks are the property of their respective owners.

What is claimed is:

1. A Context Adaptive Binary Arithmetic Coding ("CABAC") system, comprising:
   digital information storage having digital video information stored therein;
   a CABAC encoder coupled to the digital information storage to receive a portion of the digital video information at a time, the portion including symbols to encode;
   the CABAC encoder including an arithmetic coding encoding engine;
   the encoding engine including a binarizer, a binary arithmetic encoder, and contexts memory;
   the binarizer configured to binarize a symbol of the portion received to provide a binarized symbol;
   the contexts memory having probability models accessible by the binary arithmetic encoder for the encoding; and
   the binary arithmetic encoder configured to encode the binarized symbol using a selected probability model associated with the binarized symbol, the probability model being obtained from the probability models in the contexts memory.

2. The system according to claim 1, wherein the digital video information includes frames, the frames having one or more slices, and the slices having one or more macroblocks, the symbols being provided in macroblocks.

3. The system according to claim 2, wherein the binary arithmetic encoder is configured to update a probability associated with the probability model after encoding of the binarized symbol.

4. The system according to claim 3, wherein the symbols to be encoded are grouped into Syntax Element types; and wherein the binarizer maps a value of a Syntax Element type of the Syntax Element types into a binary sequence.

5. The system according to claim 3, wherein the encoding engine is implemented using a programmable logic device.

6. The system according to claim 3, wherein the encoding engine is for real-time encoding of High-Definition content.

7. The system according to claim 3, wherein the encoding engine is implemented as a bit serial encoder without having to use a microprocessor as part of the encoding engine.

8. The system according to claim 3, wherein the encoding engine is coupled to receive a clock signal and is configured to perform context update and variable normalization and first bit insertion in a single cycle of the clock signal for a real-time High-Definition application.

9. The system according to claim 8, wherein the encoding engine is configured to separately process outstanding bits from the context update, the variable normalization and the first bit insertion.

10. The system according to claim 9, wherein the encoding engine is configured to perform second bit insertion associated with the outstanding bits, the first bit insertion being for providing an output bitstream, and the second bit insertion being for inserting insert bits associated with the outstanding bits into the output bitstream.

11. The system according to claim 3, wherein for the symbol being an equiprobable symbol, the binary arithmetic encoder is configured to encode the binarized symbol as having a fixed probability distribution.

12. The system according to claim 3, wherein the binarizer has a plurality of modes of binarization including a variety of unary modes and a bypass mode, the bypass mode being for bypassing binarization of the symbol responsive to the symbol already being in a binarized state upon being obtained by the binarizer.

13. The system according to claim 12, wherein the unary modes include a general unary mode, a unary maximum length mode, a unary maximum plus exponent Golomb for run-level encoding mode, and a unary maximum plus exponent Golomb for motion vector difference encoding mode.

14. A binarizer for a Context Adaptive Binary Arithmetic Coding ("CABAC") engine, comprising:
    a binarization controller coupled to receive Syntax Element ("SE") data, an encode select signal, and a mode select signal;
    binarization blocks coupled to the binarization controller for receiving the SE data therefrom;
    the binarization blocks associated with respective unary modes;
    the SE data being binarized by each of the binarization blocks in parallel to provide multiple streams of binarized SE data;
    multiplexing circuitry for outputting the binarized SE data selected at least in part from the multiple streams of binarized SE data; and
    the binarized SE data being selected for output from the multiplexing circuitry responsive to the mode select signal.

15. The binarizer according to claim 14, wherein the encode select signal is at least in part for identifying a binary arithmetic encoding of a binary symbol using either an associated probability estimate or a fixed probability distribution.

16. The binarizer according to claim 14, wherein the unary modes include a general unary mode, a unary maximum length mode, a unary maximum plus exponent Golomb for run-level encoding mode, and a unary maximum plus exponent Golomb for motion vector difference encoding mode.

17. The binarizer according to claim 14, wherein the mode select signal is capable of being used to indicate a bypass mode for bypassing all of the unary modes and for passing the SE data through the binarizer without binarization therein.

18. The binarizer according to claim 17, wherein the binarizer is implemented in programmable logic of a programmable logic device.

19. The binarizer according to claim 17, wherein the binarization controller is configured to provide a context offset signal as a context index offset for adding to a context address for accessing contexts memory.

20. The binarizer according to claim 17, wherein in addition to the outputting of the binarized SE data, the multiplexing circuitry outputs a context status signal to use a previously used context model for encoding of the binarized SE data by the CABAC engine.

21. An apparatus, comprising:
an entropy encoder module configured to completely perform normalization of each binary input in a single clock cycle for Context Adaptive Binary Arithmetic Coding (CABAC);
the entropy encoder module including calculation blocks coupled in series and coupled to receive a clock signal; and
an initial calculation block of the calculation blocks coupled to receive an input,
wherein each of the calculation blocks represent an iteration of a normalization for the CABAC, and wherein the entropy encoder module is capable of at least High-Definition rates.

22. The apparatus according to claim 21, wherein the normalization in the single clock cycle does not include processing of outstanding bits.

23. The apparatus according to claim 22, wherein the outstanding bits are processed after the normalization.

24. The apparatus according to claim 22, wherein context information is updated in the single clock cycle.

25. The apparatus according to claim 21, wherein the entropy encoder module is implemented using programmable logic of a programmable logic device without using a microprocessor.

26. The apparatus according to claim 21, wherein:
the calculation blocks are LOW calculation blocks;
the input is a LOW input; and
the normalization is a Joint Model H.264/AVC/MPEG4 Part 10 normalization of LOW for the CABAC.

27. The apparatus according to claim 26, further comprising:
a number of iterations generation circuit configured to predetermine an iteration number for providing to multiplexer circuitry as a control select signal;
the number of iterations generation circuit coupled to receive RANGE and QUARTER inputs for selecting the iteration number;
the LOW input and interim LOW outputs respectively provided from the LOW calculation blocks being provided as multiplexer data inputs to the multiplexer circuitry; and
the multiplexer circuitry configured to select a LOW output from among the LOW input and the interim LOW outputs responsive to the iteration number.

28. The apparatus according to claim 27, wherein:
the LOW calculation blocks each include a combinational logic portion and a register portion;
the combinational logic portion is configured to provide the interim LOW outputs; and
the LOW output is provided within a single clock cycle of a clock signal used to clock a shift register associated with the LOW calculation blocks, the clock signal having a frequency associated with providing real-time High-Definition digital video encoding for CABAC.

29. The apparatus according to claim 28, wherein the number of iterations generation circuit is configured to provided a normalized RANGE responsive to the RANGE and QUARTER inputs.

30. A method for entropy encoding, comprising:
obtaining a RANGE input and a LOW input associated with Context Adaptive Binary Arithmetic Coding (CABAC);
selecting an iteration number responsive to the RANGE input;
selecting a normalized RANGE responsive the RANGE input;
inputting the LOW input to an initial LOW calculation block of LOW calculation blocks coupled in series;
normalizing the LOW input with the initial LOW calculation block;
registering the normalized LOW input in a first register of the initial LOW calculation block on a clock cycle of a clock signal;
propagating the normalized LOW input registered to a second register of next LOW calculation block in the series on a next clock cycle of the clock signal, the first register and the second register being clocked by the clock signal;
generating normalized LOWs respectively from the LOW calculation blocks;
selecting from among the LOW input and the normalized LOWs, a LOW output responsive to the iteration number; and
outputting an encoded bitstream using in part the LOW output.

31. The method according to claim 30, wherein normalization of the RANGE input and the LOW input is performed in a single clock cycle of the clock signal.

32. The method according to claim 31, wherein the normalization is for real-time High-Definition digital video encoding.

33. The method according to claim 32, further comprising:
separating out outstanding bits from other bits associated with the LOW input and the RANGE input, the other bits being those to be normalized;
the separating including marking locations of bit insertions, incrementing a count, and masking responsive to an iteration number; and
after completing normalization associated with the other bits, parsing to add insert bits at identified locations into the encoded bitstream where the insert bits are associated with the outstanding bits.

34. The method according to claim 33, further comprising:
updating probability associated with a portion of a frame;
updating context associated with the portion of the frame; and
providing the RANGE input and the LOW input responsive to the updated probability and the updated context.

35. The method according to claim 34, further comprising feeding back the normalized RANGE and the normalized LOW input for the updating of the probability and the updating of the context.

36. The method according to claim 35, wherein the updating of the probability and the updating of the context are done within the single clock cycle.

37. The method according to claim 36, wherein the parsing includes:
generating a bit mask responsive to the iteration number; and
applying the bit mask to bit insertion markers.

38. A method for entropy encoding, comprising:

obtaining a portion of a frame of image information to encode;

separating out outstanding bits from other bits of the portion for Context Adaptive Binary Arithmetic Coding (CABAC);

updating probability and context information associated with the portion;

normalizing using the other bits and the updated probability and context information to provide an encoded bitstream;

parsing the outstanding bits responsive to location marking, counting, and bit masking for providing insert bits, the outstanding bits being parsed after the normalizing;

inserting the insert bits associated with outstanding bits into the encoded bitstream; and outputting the encoded bitstream.

39. The method according to claim 38, wherein the updating and the normalizing are performed in a single clock cycle for providing the encoded bitstream in real-time with High-Definition resolution.

* * * * *